(12) United States Patent
Takekida

(10) Patent No.: US 8,466,506 B2
(45) Date of Patent: Jun. 18, 2013

(54) NONVOLATILE SEMICONDUCTOR MEMORY DEVICE AND METHOD OF MANUFACTURING THE SAME

(75) Inventor: Hideto Takekida, Nagoya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 13/053,924

(22) Filed: Mar. 22, 2011

(65) Prior Publication Data

US 2011/0254073 A1  Oct. 20, 2011

(30) Foreign Application Priority Data

Apr. 19, 2010  (JP) .................................. 2010-096033

(51) Int. Cl.
*H01L 29/788* (2006.01)

(52) U.S. Cl.
USPC ........................................................ 257/315

(58) Field of Classification Search
USPC ................. 257/314–316, E29.255, E29.3
See application file for complete search history.

(56) References Cited

U.S. PATENT DOCUMENTS

| 5,946,230 | A * | 8/1999 | Shimizu et al. | .......... 365/185.01 |
| 2006/0278919 | A1 * | 12/2006 | Takahashi | ..................... 257/316 |

FOREIGN PATENT DOCUMENTS

| JP | 2002-359308 | 12/2002 |
| JP | 2006-344900 | 12/2006 |

OTHER PUBLICATIONS

U.S. Appl. No. 13/336,398, filed Dec. 23, 2011, Sato, et al.
U.S. Appl. No. 13/336,255, filed Dec. 23, 2011, Takekida.
U.S. Appl. No. 13/398,208, filed Feb. 16, 2012, Takekida.

* cited by examiner

*Primary Examiner* — Jarrett Stark
*Assistant Examiner* — Michele Fan
(74) *Attorney, Agent, or Firm* — Oblon, Spivak, McClelland, Maier & Neustadt, L.L.P.

(57) ABSTRACT

Nonvolatile semiconductor memory device includes; a first element isolation insulation layer within a first dummy cell region; a second element isolation insulation layer within a second dummy cell region; and a third element isolation insulation layer at boundary between the first and second dummy cell regions. Top surface of the first element isolation insulation layer is located lower than that of first floating electrode layers. Top surface of the second element isolation insulation layer is located at the same height as that of second floating electrode layers. The third element isolation insulation layer has a top surface. The end portion of the top surface adjoining the first floating electrode layer is located at a height lower than the top surface of the first floating electrode layer. The top surface of the third element isolation insulation layer has gradient ascending from the side surface of the first floating electrode layer toward that of the second floating electrode layer.

12 Claims, 32 Drawing Sheets

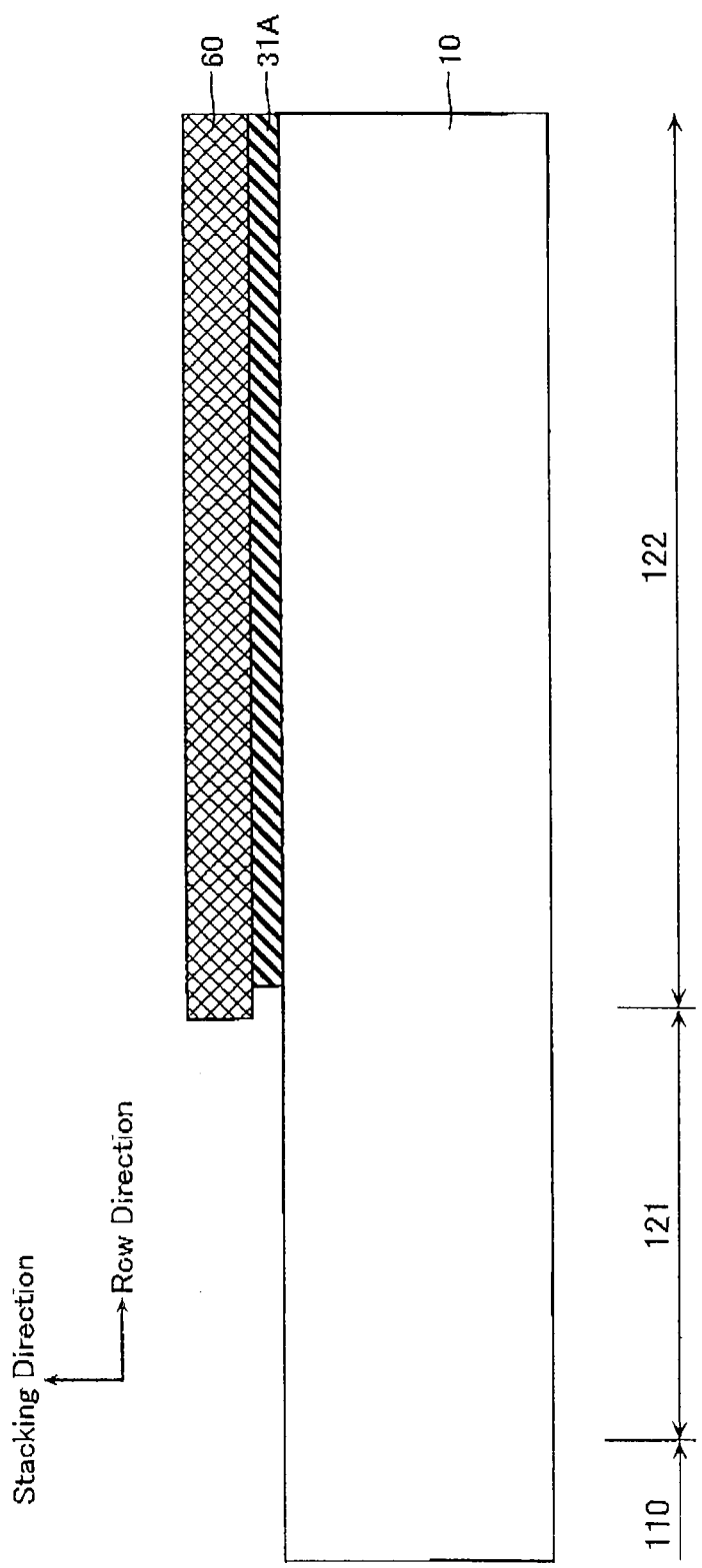

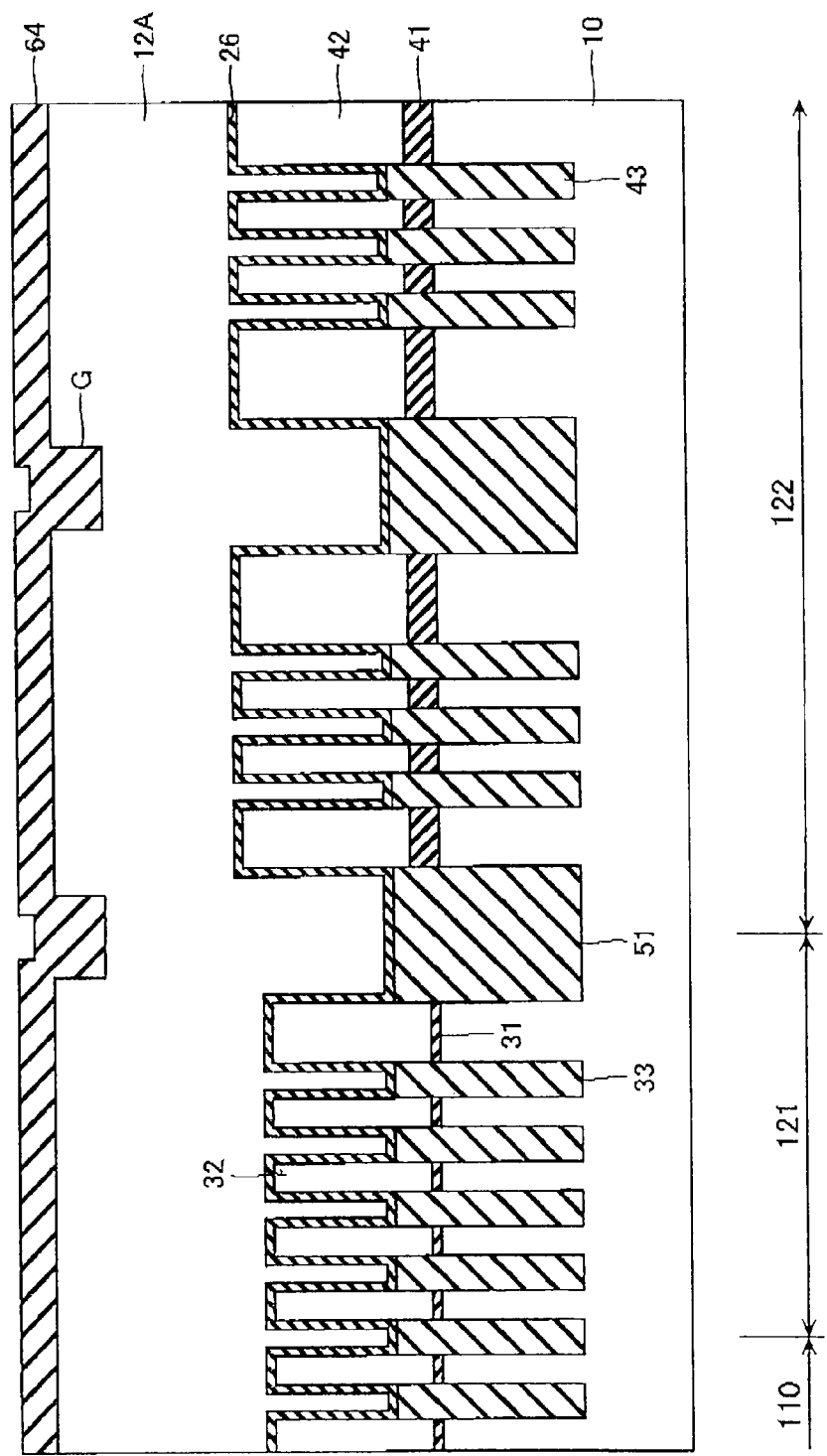
FIG. 8B Comparative Example

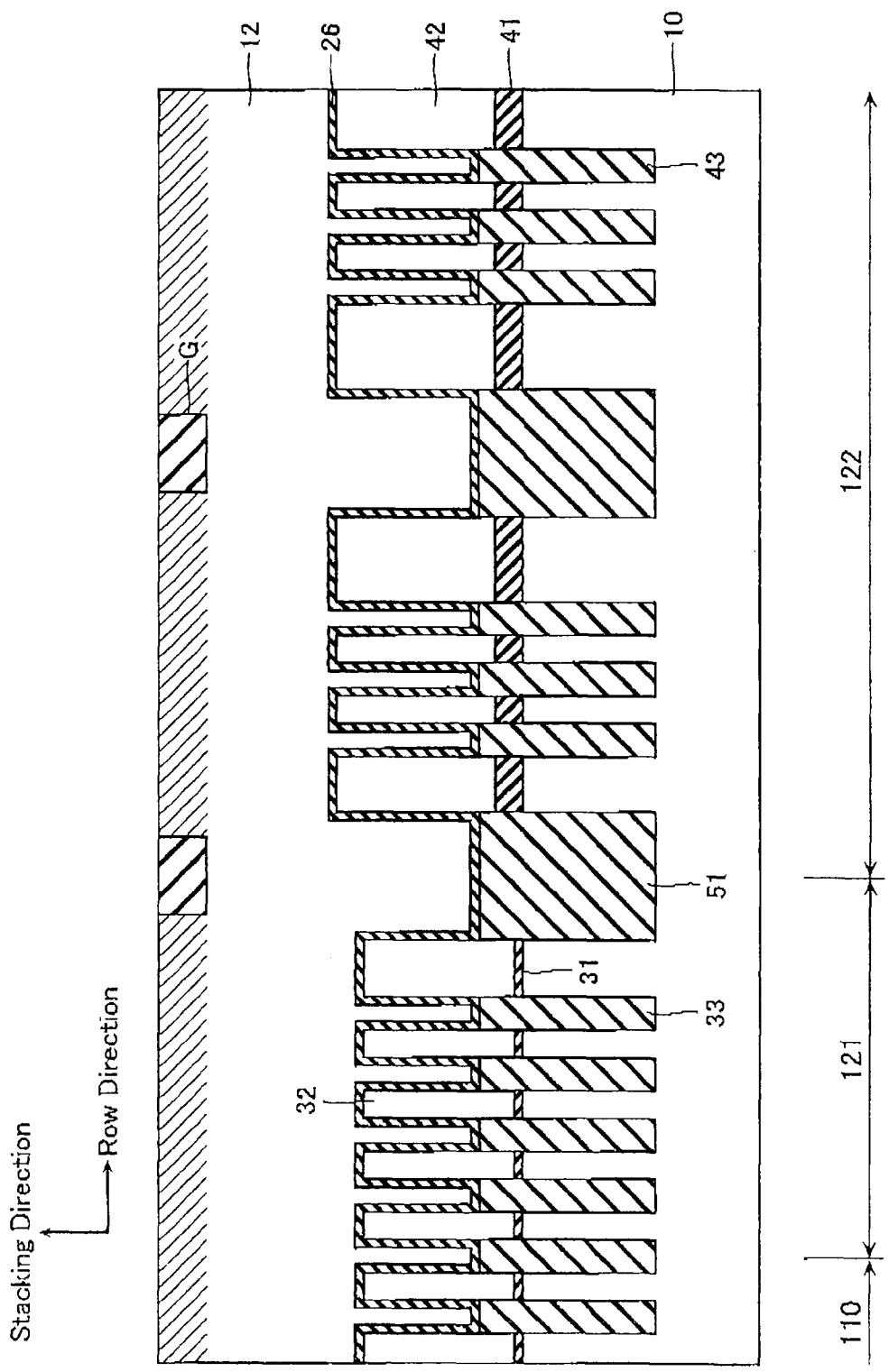
FIG. 8C Comparative Example

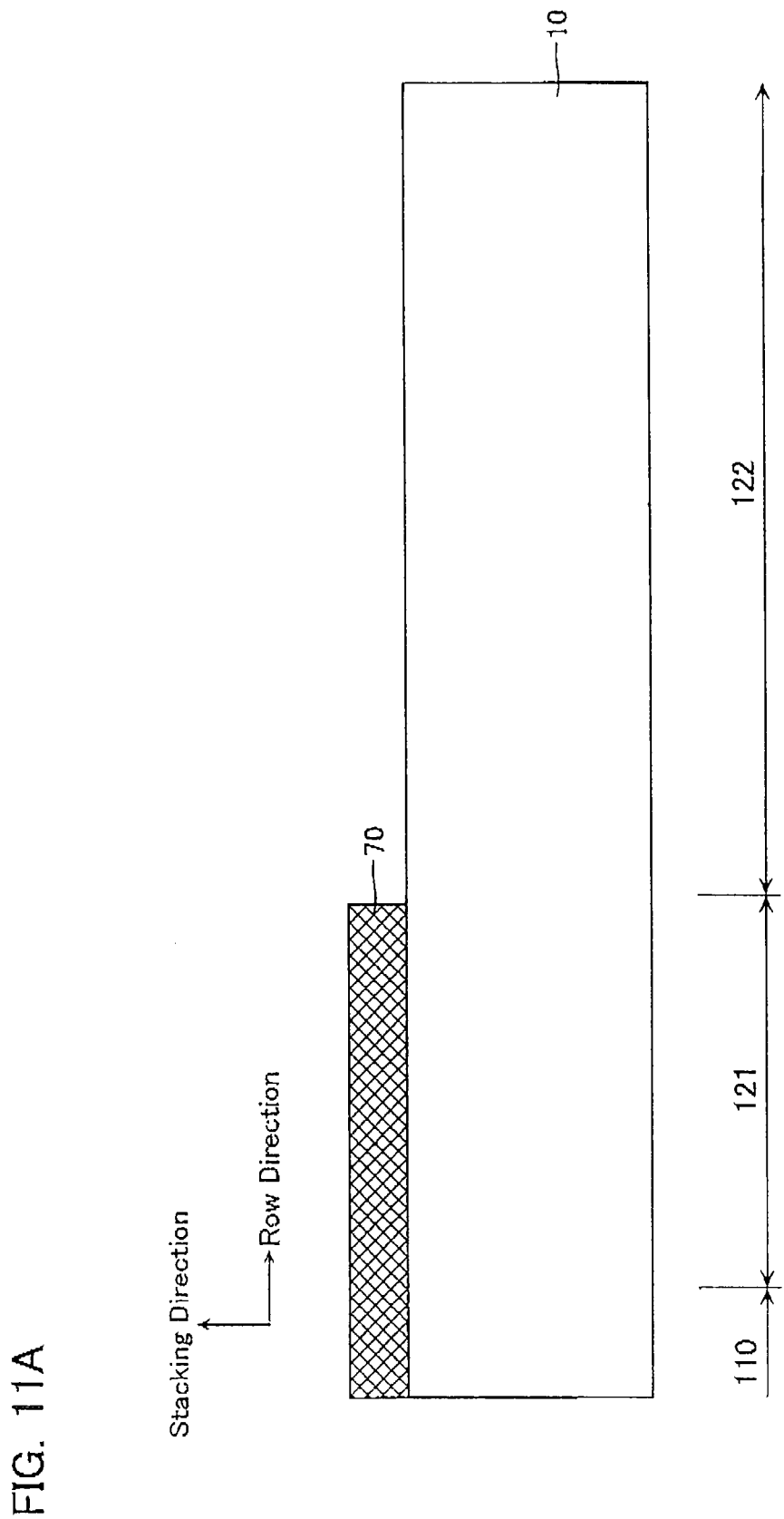

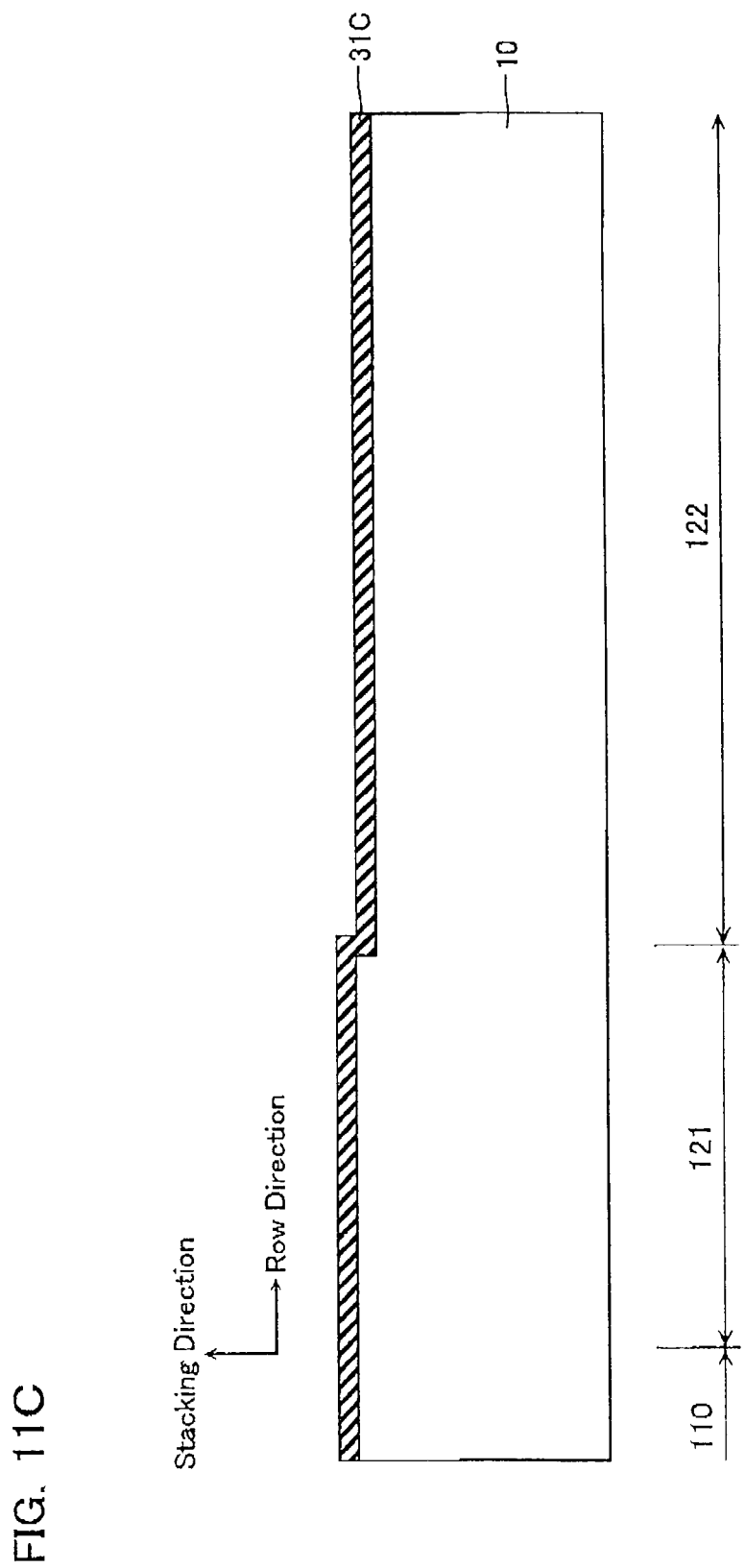

NONVOLATILE SEMICONDUCTOR MEMORY DEVICE AND METHOD OF MANUFACTURING THE SAME

CROSS REFERENCE TO RELATED APPLICATIONS

This application is based on and claims the benefit of priority from prior Japanese Patent Application No. 2010-96033, filed on Apr. 19, 2010, the entire contents of which are incorporated herein by reference.

FIELD

Embodiments described herein relate generally to an electrically data-rewritable nonvolatile semiconductor memory device and a method of manufacturing the same.

BACKGROUND

NAND type flash memory is known as a nonvolatile semiconductor memory device that is electrically rewritable and highly integrable. A NAND type flash memory includes a memory cell region in which memory cells (transistors) for storing data are arranged. A memory cell has a stacked gate structure configured by a charge accumulation layer (floating gate) and a control gate stacked on a semiconductor substrate via an insulation film.

Recently, along with progressing miniaturization of NAND type flash memory, it has become common to provide dummy cell regions near the memory cell region in order to secure margins for lithography. The dummy cell regions are necessary for forming the memory cell region to have a minimum feature size, though the dummy cell regions themselves are not formed to have a minimum feature size.

However, the stacked structure of the dummy cell regions has not yet become able to suppress deterioration of device characteristics of the memory cell region sufficiently.

BRIEF DESCRIPTION OF THE DRAWINGS

FIG. 7B is a diagram showing a step of manufacturing the nonvolatile semiconductor memory device according to the first embodiment.

FIG. 8B is a diagram showing a step of manufacturing the nonvolatile semiconductor memory device according to the comparative example.

FIG. 8C is a diagram showing a step of manufacturing the nonvolatile semiconductor memory device according to the comparative example.

FIG. 11A is a diagram showing a step of manufacturing a nonvolatile semiconductor memory device according to the second embodiment.

FIG. 11C is a diagram showing a step of manufacturing the nonvolatile semiconductor memory device according to the second embodiment.

DETAILED DESCRIPTION

Figure 1:
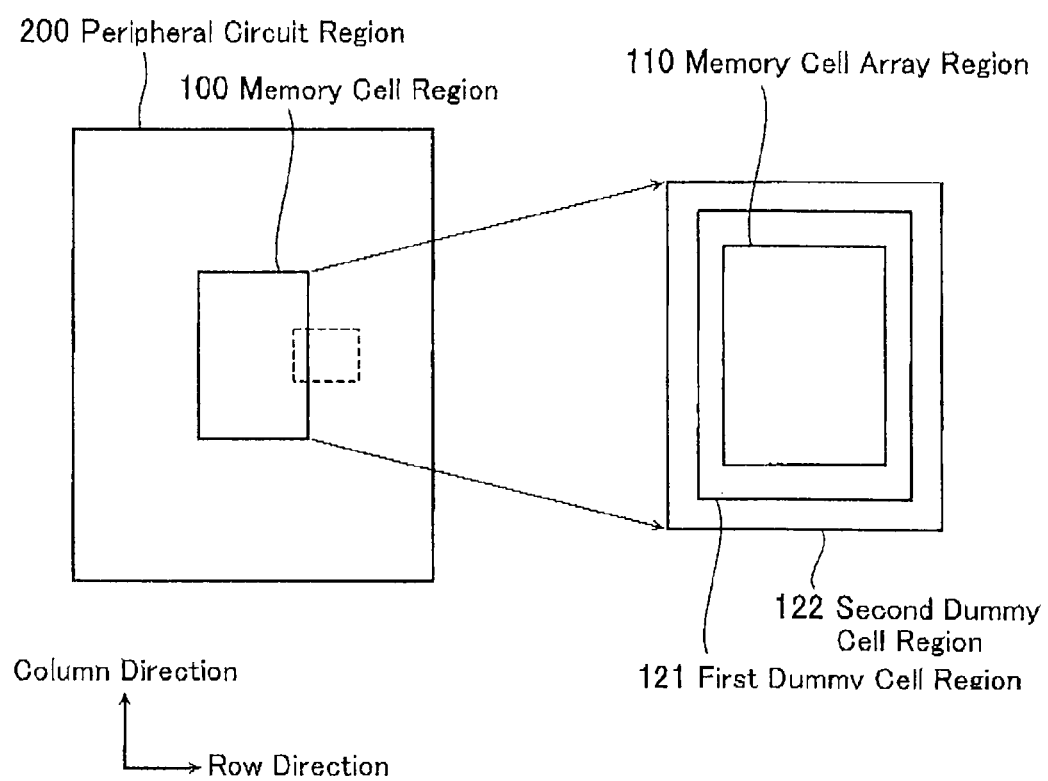
FIG. 1 is a circuit diagram of a nonvolatile semiconductor memory device according to a first embodiment.

A nonvolatile semiconductor memory device according to one embodiment includes a semiconductor substrate, a memory cell array region, a first dummy cell region, and a second dummy cell region. The memory cell array region is provided on the semiconductor substrate and has memory transistors for storing data arranged therein. The first dummy cell region is provided on the semiconductor substrate to adjoin the memory cell array region and has first dummy cells not used for storing data arranged therein. The second dummy cell region is provided on the semiconductor substrate to adjoin the first dummy cell region and has second dummy cells not used for storing data arranged therein. The first dummy cell region is provided between the memory cell array region and the second dummy cell region. The first dummy cell region includes first gate insulation layers, first floating electrode layers, and a first element isolation insulation layer. The first gate insulation layers are provided on the semiconductor substrate. The first floating electrode layers are provided on the first gate insulation layers and form the first dummy cells. The first element isolation insulation layer is formed to adjoin the first floating electrode layers and electrically isolates the first dummy cells from each other. The top surface of the first element isolation insulation layer is located at a height lower than the top surfaces of the first floating electrode layers. The second dummy cell region includes second gate insulation layers, second floating electrode layers, and a second element isolation insulation layer. The second gate insulation layers are provided on the semiconductor substrate and have a thickness larger than that of the first gate insulation layers. The second floating electrode layers are provided on the second gate insulation layers and form the second dummy cells. The second element isolation insulation layer is formed to adjoin the second floating electrode layers and electrically isolates the second dummy cells from each other. The top surface of the second element isolation insulation layer is located at the same height as the top surfaces of the second floating electrode layers, or at a height lower than the top surfaces of the second floating electrode layers and higher than the top surface of the first element isolation insulation layer. The first dummy cell region and the second dummy cell region include a third element isolation insulation layer, a block insulation layer, and a conductive layer. The third element isolation insulation layer is formed at the boundary between the first dummy cell region and the second dummy cell region and electrically isolates the first dummy cells and the second dummy cells from each other. The block insulation layer is formed on the first element isolation insulation layer, the second element isolation insulation layer, the third element isolation insulation layer, the first floating electrode layers, and the second floating electrode layers. The conductive layer is formed on the first element isolation insulation layer, the second element isolation insulation layer, the third element isolation insulation layer, the first floating electrode layers, and the second floating electrode layers via the block insulation layer, and functions as the gates of the memory transistors. The third element isolation insulation layer has a top surface. The end portion of the top surface adjoining the first floating electrode layer is located at a height lower than the top surface of the first floating electrode layer. The top surface of the third element isolation insulation layer has a gradient that ascends from the side surface of the first floating electrode layer toward the side surface of the second floating electrode layer.

A method of manufacturing a nonvolatile semiconductor memory device according to one embodiment is a method of manufacturing a nonvolatile semiconductor memory device including a first dummy cell region and a second dummy cell region. The first dummy cell region is provided to adjoin a memory cell array region configured to store data. The second dummy cell region is provided to adjoin the first dummy cell region. In this manufacturing method, first gate insulation layers having a first thickness are formed on a semiconductor substrate within the first dummy cell region of the semiconductor substrate, and second gate insulation layers having a second thickness larger than the first thickness are formed on the semiconductor substrate within the second dummy cell region of the semiconductor substrate. Next, first floating electrode layers are formed on the first gate insulation layers and second floating electrode layers are formed on the second gate insulation layers. Then, a first element isolation insulation layer is formed between the first floating electrode layers up to height of the top surfaces of the first floating electrode layers, a second element isolation insulation layer is formed between the second floating electrode layers up to the height of the top surfaces of the second floating electrode layers, and a third element isolation insulation layer is formed at a boundary between the first floating electrode layer and the second floating electrode layer up to the height of the top surfaces of the first floating electrode layer and the second floating electrode layer. Next, the first element isolation insulation layer is removed down to a certain depth from the height of the top surfaces of the first floating electrode layers while the second element isolation insulation layer is left un-removed, and the shape of the third element isolation insulation layer is processed.

A nonvolatile semiconductor memory device and a method of manufacturing the same according to the present embodiment will now be explained with reference to the drawings.

First Embodiment

[Configuration]

First, the whole configuration of a nonvolatile semiconductor memory device according to a first embodiment will be explained. FIG. 1 is a schematic top view of the nonvolatile semiconductor memory device according to the first embodiment.

As shown in FIG. 1, the nonvolatile semiconductor memory device according to the first embodiment includes a memory cell region 100 and a peripheral circuit region 200 provided around the memory cell region 100. The memory cell region 100 includes a memory cell array region 110 having memory transistors (memory cells) for storing data arranged therein, and first and second dummy cell regions 121 and 122 provided around the memory cell array region 110 and each having dummy cells arranged therein. The first dummy cell region 121 adjoins the memory cell array region 110, and the second dummy cell region 122 adjoins the first dummy cell region 121 and the peripheral circuit region 200. The first and second dummy cell regions 121 and 122 are not provided with such elements as transistors, etc., but arranged with dummy cells not used for data storage. The dummy cells are necessary for processing the memory cell region 100 to have a minimum feature size.

Figure 2:
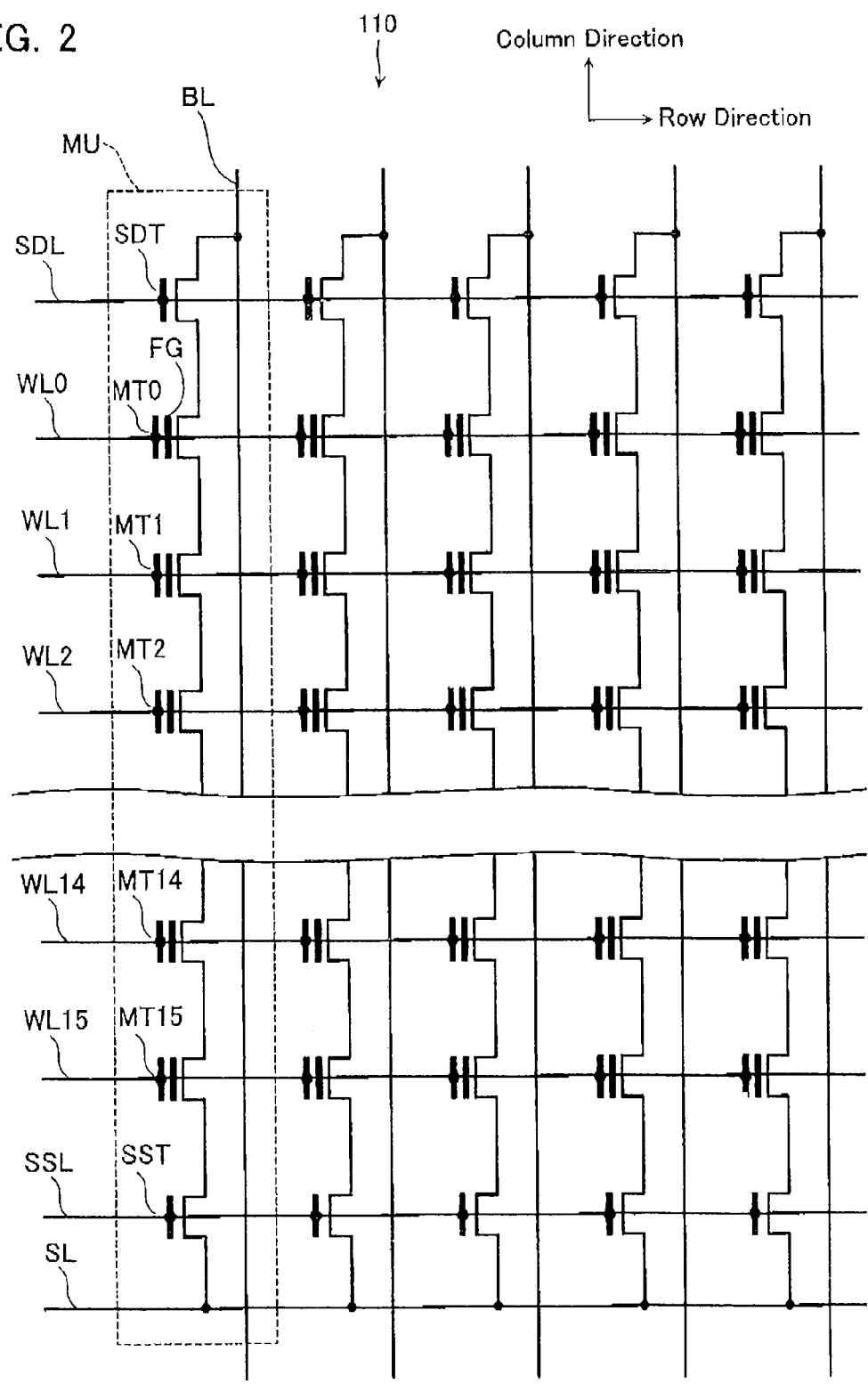
FIG. 2 is an equivalent circuit diagram of a memory cell array region 110 according to the first embodiment.

Next, the circuit configuration of the memory cell array region 110 will be explained with reference to FIG. 2. The memory cell array region 110 includes a plurality of memory units MU having a longer direction extending in a column direction and arranged side by side in a row direction. Each memory unit MU includes memory cell transistors MT0 to MT15, a drain side select transistor SDT connected to the drain of the memory cell transistor MT0, and a source side select transistor SST connected to the source of the memory cell transistor MT15. When the memory cell transistors MT0, MT1, . . . , and MT15 are referred to generically, they are described as memory cell transistors MT without numerals 0, 1, . . . , and 15.

The drain of the drain side select transistor SDT is connected to a bit line BL extending in the column direction. The bit line BL is used for transferring write data to a memory cell transistor MT during a write operation and for reading out read data from a memory cell transistor MT during a read operation.

The sources of a plurality of source side select transistors SST arranged in line in the row direction are connected to one source line SL extending in the row direction.

The memory cell transistor MT stores charges in a floating gate FG and discharges charges from the floating gate FG. A plurality of memory cell transistors MT0 arranged in line in the row direction are connected commonly to one word line WL0 extending in the row direction. Likewise, a plurality of memory cell transistors MT1 to a plurality of memory cell transistors MT15 are connected commonly to one word line WL1 to one word line WL15 extending in the row direction respectively. When the word lines WL0, WL1, . . . , and WL15 are referred to generically, they are described as word lines WL without numerals 0, 1, . . . , and 15.

The gates of a plurality of drain side select transistors SDT arranged in line in the row direction are connected commonly to one drain side select gate line SDL extending in the row direction.

The gates of the plurality of source side select transistors SST arranged in line in the row direction are connected commonly to one source side select gate line SSL extending in the row direction.

The row direction is a direction in which the word lines WL, the drain side select gate line SDL, etc. extend, and the column direction is a direction which is orthogonal to the row direction and in which the bit lines BL, etc. extend. FIG. 2 shows one example in which the memory unit MU is configured by sixteen memory cell transistors MT0 to MT15, one drain side select transistor SDT, and one source side select transistors SS. However, the memory cell array region 110 according to the present embodiment is not limited to this.

Figure 3:
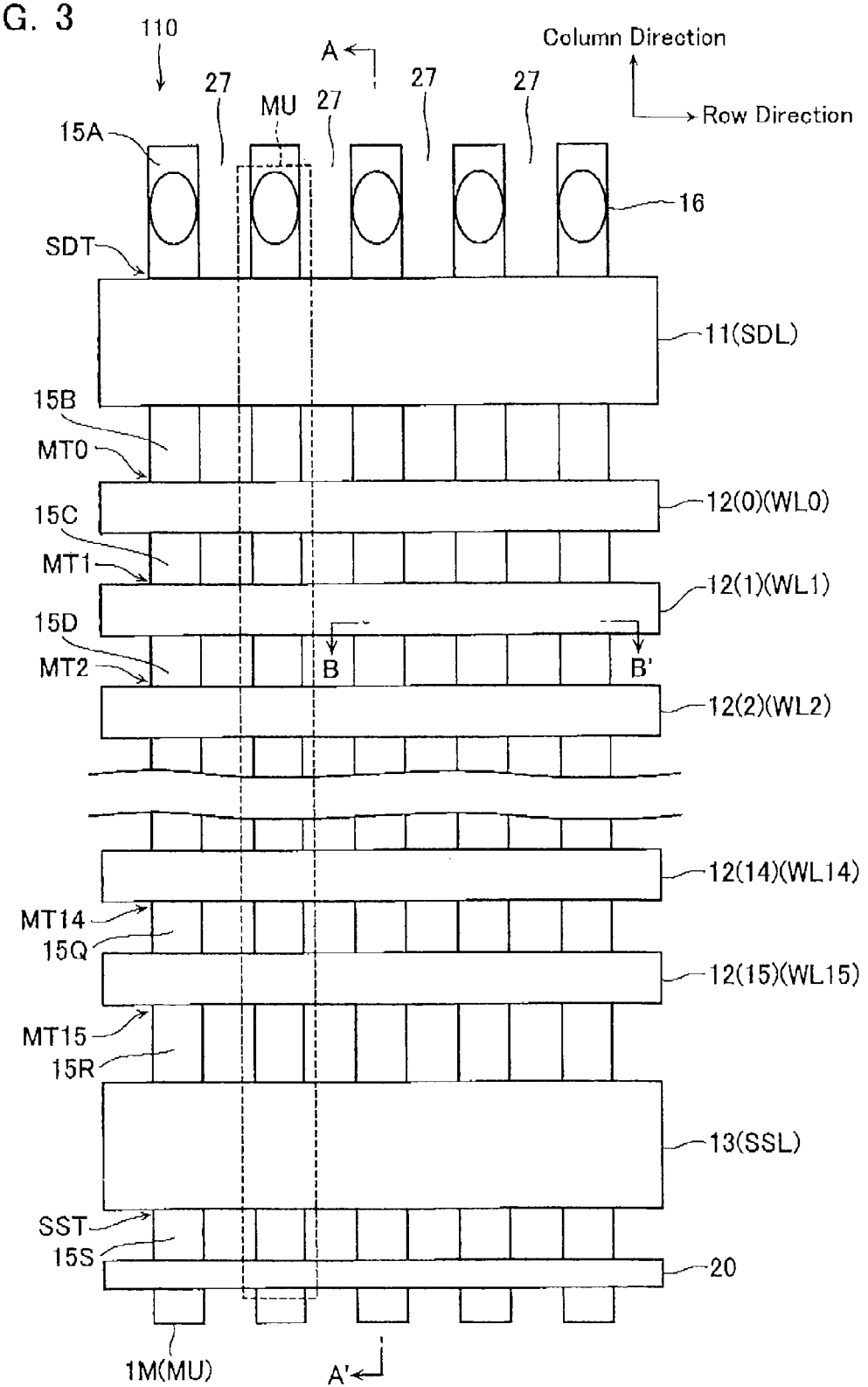
FIG. 3 is a schematic top view of the memory cell array region 110 according to the first embodiment.
Figure 4A:
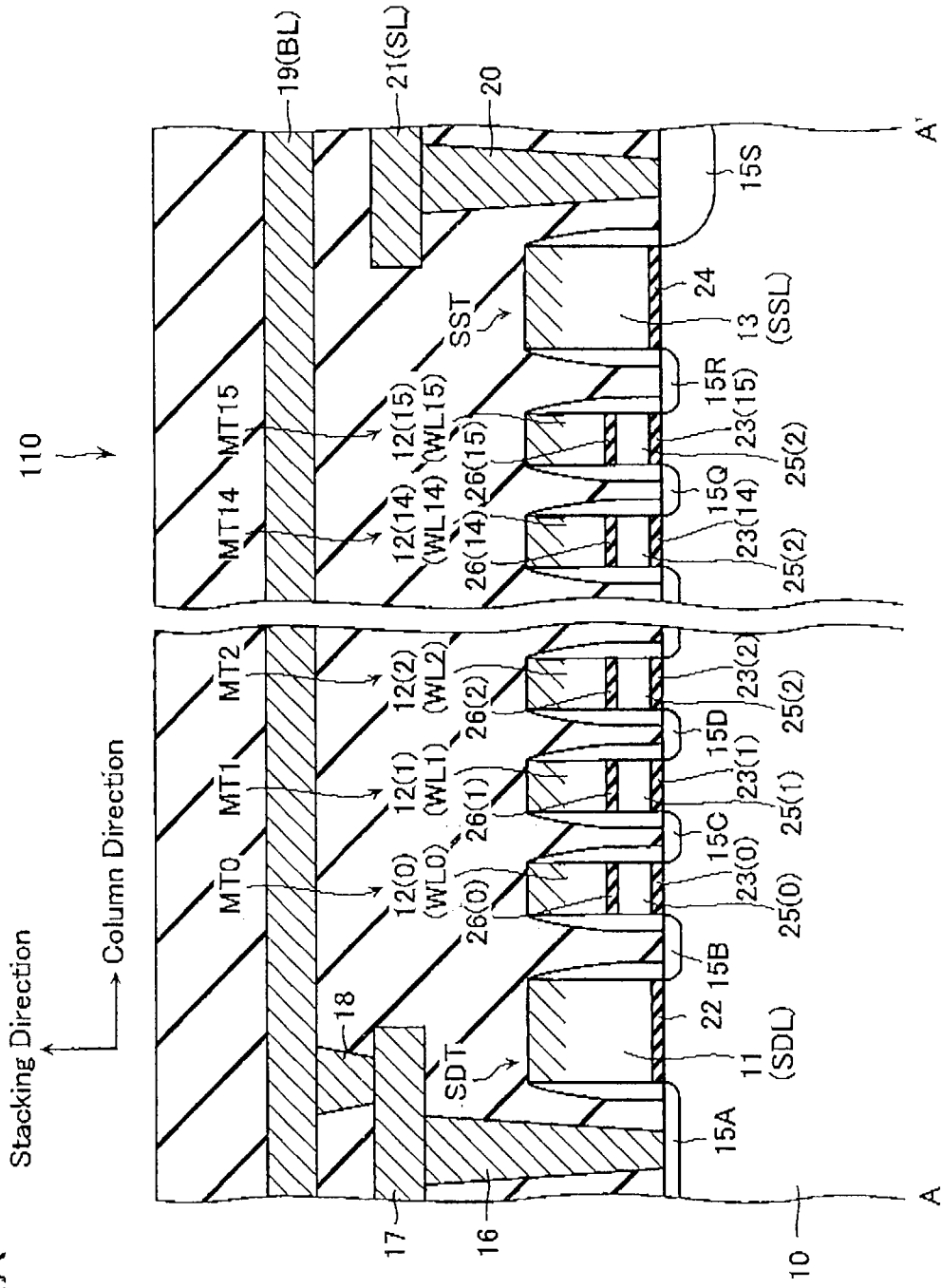
FIG. 4A is a cross-sectional diagram of FIG. 3 taken along a line A-A'.
Figure 4B:
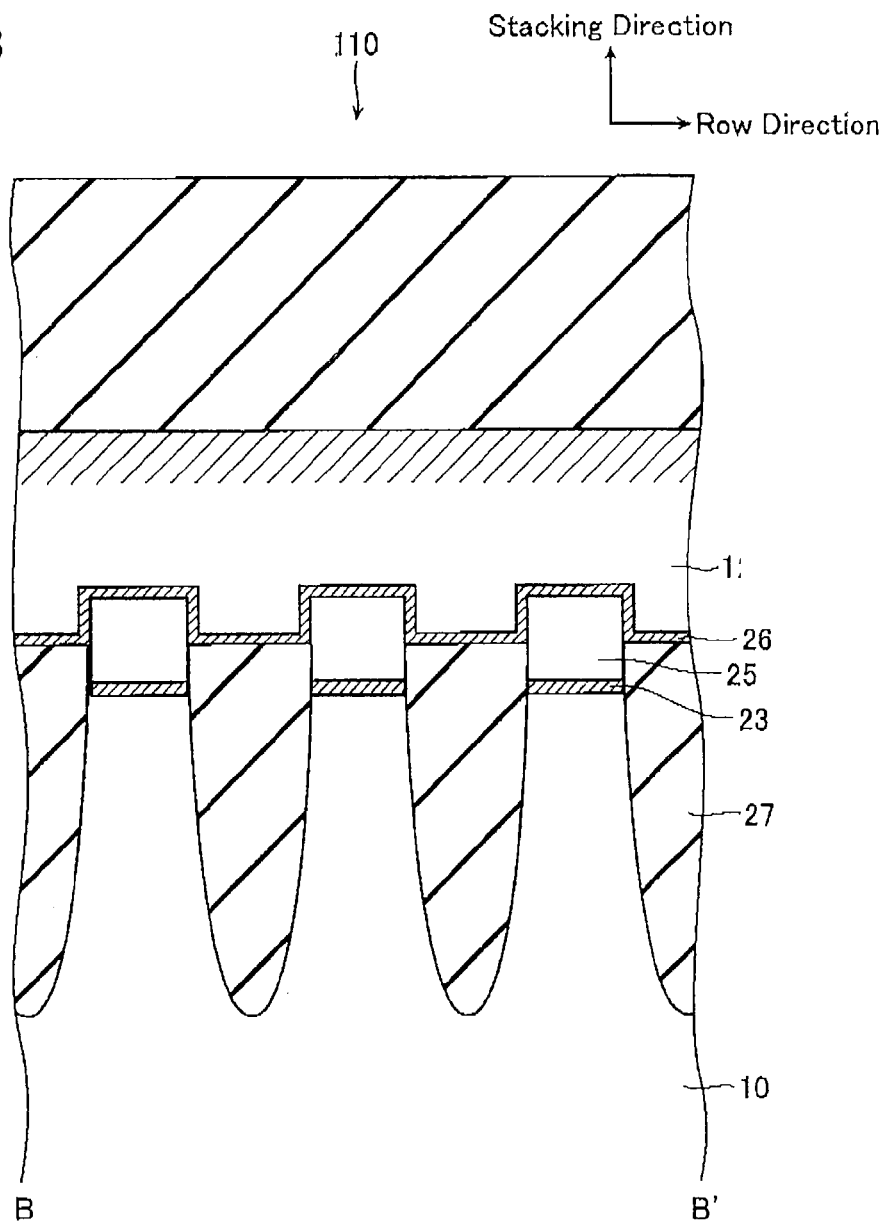
FIG. 4B is a cross sectional diagram of FIG. 3 taken along a line B-B'.

Next, a stacked structure of the memory cell array region 110 will be explained with reference to FIG. 3, FIG. 9A, and FIG. 4B. FIG. 3 is a schematic top view of the memory cell array region 110. FIG. 4A is a cross-sectional diagram of FIG. 3 taken along a line A-A'. FIG. 4B is a cross-sectional diagram of FIG. 3 taken along a line B-B'.

As shown in FIG. 3, the memory cell array region 110 includes a plurality of activation regions 1M, a drain side conductive layer 11, word line conductive layers 12(0) to 12(15), and a source side conductive layer 13. The plurality of activation regions 1M are formed on a semiconductor substrate 10 to extend in the column direction with a certain pitch therebetween in the row direction. The width and the interval of the activation regions 1M are substantially equal to the minimum feature size. Each activation region 1M includes a layer functioning as the memory unit MU. When the word line conductive layers 12(0), 12(1), . . . , and 12(15) are referred to generically, they are described as word line conductive layers 12 without parenthesized numerals (0), (1), . . . , and (15).

As shown in FIG. 3, the drain side conductive layer 11, the word line conductive layers 12, and the source side conductive layer 13 are formed to extend in the row direction striding the plurality of activation regions 1M and with a certain pitch therebetween in the column direction. The drain side conductive layer 11 functions as the drain side select gate line SDL and the gates of the drain side select transistors SDT. The word line conductive layers 12(0) to 12(15) function as the word lines WL0 to WL15 and the gates of the memory cell transistors MT0 to MT15. The source side conductive layer 13 functions as the source side select gate line SSL and the gates of the source side select transistors SST. The drain side conductive layer 11, the word line conductive layers 12, and the source side conductive layer 13 are made of silicided polysilicon mainly.

As shown in FIG. 3, the activation region 1M has impurity diffused regions 15A to 15S in the surface of the semiconductor substrate 10. The impurity diffused regions 15A to 15S are formed between the source side conductive layer 11, the word line conductive layers 12(0) to 12(15), and the drain side conductive layer 13. When the impurity diffused regions 15A, 15B, . . . , and 15S are referred to generically, they are described as impurity diffused regions 15 without alphabets A, B, . . . , and S.

As shown in FIG. 3 and FIG. 4A, the impurity diffused regions 15A and 15B are formed to sandwich the drain side conductive layer 11. The impurity diffused region 15A functions as the drain of the drain side select transistor SDT and the impurity diffused region 15B functions as the source of the drain side select transistor SDT. The impurity diffused region 15B also functions as the drain of the memory cell transistor MT0.

As shown in FIG. 3 and FIG. 4A, the impurity diffused region 15A is connected to a bit line contact layer 16 formed to extend perpendicularly to the semiconductor substrate 10. The bit line contact layer 16 is connected to a bit line layer 19 through layers 17 and 18. The bit line layer 19 functions as a bit line BL. A plurality of bit line layers 19 are formed to extend in the column direction with a certain pitch therebetween in the row direction As shown in FIG. 3 and FIG. 4A, the impurity diffused regions 15C to 15Q are formed at both ends of the word line conductive layers 12(0) to 12(15), and function as the sources and drains of the memory cell transistors MT0 to MT15.

As shown in FIG. 3 and FIG. 4A, the impurity diffused regions 15R and 15S are formed to sandwich the source side conductive layer 13. The impurity diffused region 15R functions as the drain of the source side select transistor SST, and the impurity diffused region 15S functions as the source of the source side select transistor SST. The impurity diffused region 15R also functions as the source of the memory cell transistor MT15.

As shown in FIG. 3 and FIG. 4A, the impurity diffused region 15S is connected to a source line contact layer 20 formed to extend perpendicularly to the semiconductor substrate 10. The source line contact layer 20 is connected to a source line conductive layer 21. The source line conductive layer 21 functions as the source line SL. As shown in FIG. 3, the source line contact layer 20 is formed continuously in the row direction in a manner to connect a plurality of sources (i.e., a plurality of impurity diffused regions 15S) of the plurality of source side select transistors SST commonly. This configuration can suppress the resistance value of the source line contact layer 20.

As shown in FIG. 4A, the activation region 1M includes: gate insulation layers 22 and 24 provided on the semiconductor substrate 10; tunnel insulation layers 23(0) to 23(15); floating electrode layers 25(0) to 25(15) provided on the tunnel insulation layers 23(0) to 23(15); and block insulation layers 26(0) to 26(15) provided on the floating electrode layers 25(0) to 25(15). The floating electrode layers 25(0) to 25(15) function as the floating gates FG of the memory transistors MT0 to MT15. When the tunnel insulation layers 23(0), 23(1), . . . , and 23(15) are referred to generically, they are described as tunnel insulation layers 23 without parenthesized numerals (0), (1), . . . , and (15). Likewise, when the floating electrode layers 25(0), 25(1), . . . , and 25(15) are referred to generically, they are described as floating electrode layers 25 without parenthesized numerals (0), (1), . . . , and (15). When the block insulation layers 26(0), 26(1), . . . , 26(15) are referred to generically, they are described as block insulation layers 26 without parenthesized numerals (0), (1), . . . , and (15).

As shown in FIG. 4A, the gate insulation layer 22 is formed to contact the bottom surface of the drain side conductive layer 11. The gate insulation layer 24 is formed to contact the bottom surface of the source side conductive layer 13. As shown in FIG. 4A, the block insulation layers 26(0) to 26(15) are formed to contact the bottom surfaces of the word line conductive layers 12(0) to 12(15) respectively. As shown in FIG. 4B, the block insulation layers 26(0) to 26(15) are formed to cover a plurality of floating electrode layers 25(0) to 25(15) arranged in line in the row direction, respectively. The gate insulation layers 22 and 24, the tunnel insulation layers 23, and the block insulation layers are made of silicon oxide mainly. The floating electrode layers 25 are made of polysilicon mainly.

The gate insulation layers 22 and 24 and the tunnel insulation layers 23 are formed on the same layer. The gate insulation layers 22 and 24 and the tunnel insulation layers 23 are formed by dividing layers formed on the semiconductor substrate 10. Likewise, the drain side conductive layer 11, the word line conductive layers 12, and the source side conductive layer 13 are formed by dividing layers formed on the semiconductor substrate 10.

As shown in FIG. 3 and FIG. 49, the memory cell array region 110 includes element isolation insulation layers 27 which adjoin the floating electrode layers 25 and electrically isolate the plurality of activation regions 1M (memory units MU) adjoining each other in the row direction. The top surfaces of the element isolation insulation layers 27 are located at a height lower than the top surfaces of the floating electrode layers 25, and the bottom surfaces thereof are located at a certain depth from the surface of the semiconductor substrate 10. The element isolation insulation layers 27 are made of silicon oxide mainly.

Next, activation regions 1D1, 1D2, 1D3, and 1P within the first dummy cell region 121, the second dummy cell region 122, and the peripheral circuit region 200 will be explained with reference to FIG. 5. The activation regions 1D1, 1D2, and 1D3 are regions in which dummy cells are formed, and the activation region 1P is a region in which circuit elements such as transistors, etc. configuring peripheral circuits are formed.

Figure 5:
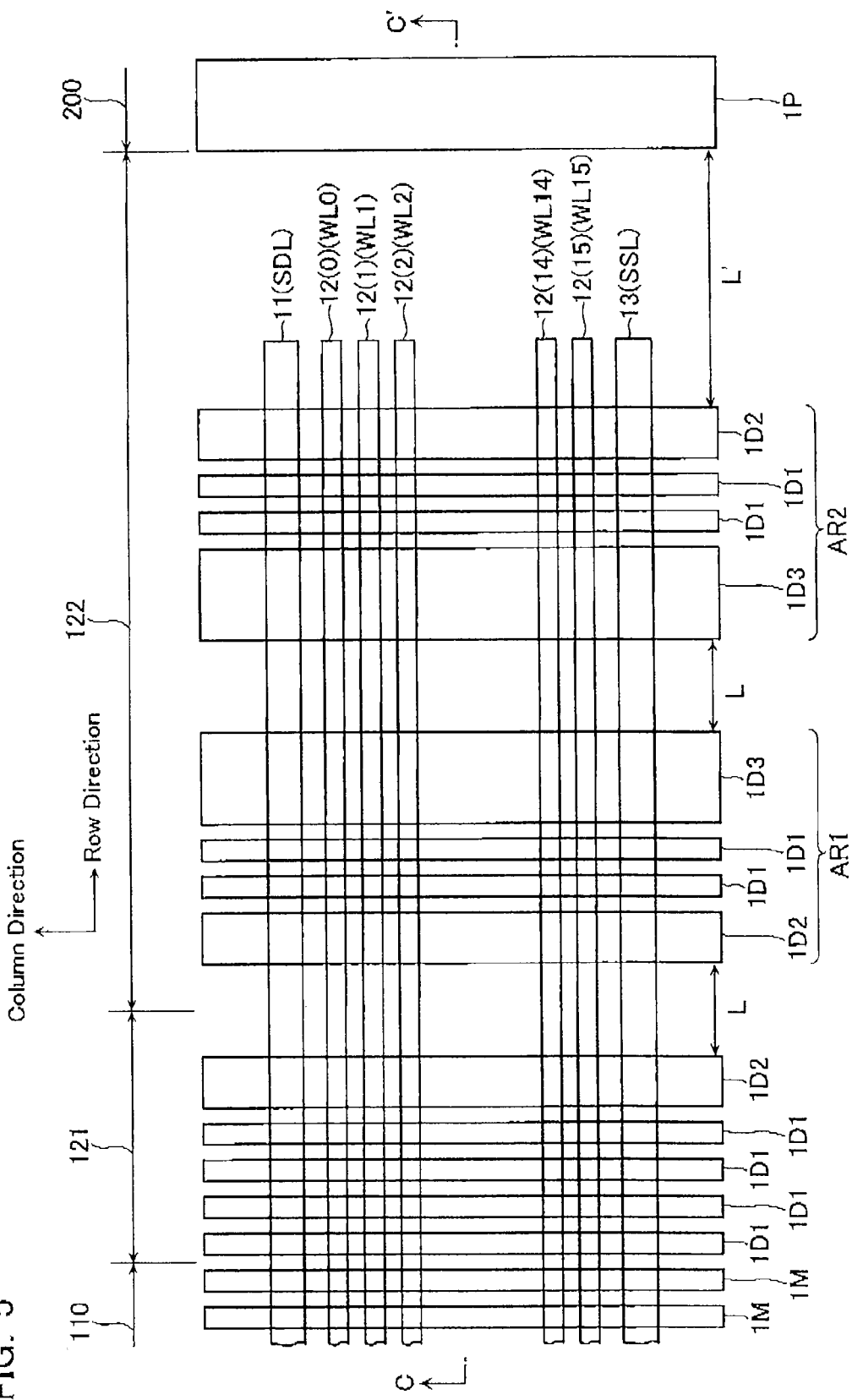
FIG. 5 is a diagram showing activation regions 1D1, 1D2, 1D3, and 1P according to the first embodiment.

As shown in FIG. 5, the first dummy cell region 121 includes, for example, a plurality of (four in FIG. 5) activation regions 1D1 on the side closer to the memory cell array region 110, and some activation region 1D2 (one in FIG. 5) on the side closer to the peripheral circuit region 200. The width and interval of the activation regions 1D1 are the minimum feature size (same as the width and the interval of the activation regions 1M). The width of the activation region 1D2 is larger than the width of the activation regions 1D1. The relationship between the width of the activation region 1D1 and the width of the activation region 1D2 is determined by taking lithography margin into consideration. It is possible to secure lithography margin by gradually increasing the width of the activation regions 1D1 and 1D2.

The second dummy cell region 122 includes an activation region group AR1 on the side closer to the memory cell array region 110, and an activation region group AR2 on the side closer to the peripheral circuit region 200. The activation region group AR1 includes some activation region 1D2 (one in FIG. 5) on the side closer to the memory cell array region 110. The activation region group AR1 includes some activation region 1D3 (one in FIG. 5) on the side closer to the peripheral circuit region 200. The activation region group AR1 includes some activation regions 1D1 (two in FIG. 5) between the activation region 1D2 and the activation region 1D3. The width of the activation region 1D3 is larger than the width of the activation region 1D2. The activation region group AR2 includes some activation region 103 (one in FIG. 5) on the side closer to the memory cell array region 110. The activation region group AR2 includes some activation region 1D2 (one in FIG. 5) closer to the peripheral circuit region 200. The activation region group AR2 includes some activation regions 1D1 (two in FIG. 5) between the activation region 103 and the activation region 1D2. That is, the activation region group AR2 is in the mirror image relationship with the activation region group AR1.

The activation region 1D2 within the first dummy cell region 121 is apart from the activation region 1D2 included in the activation region group AR1 within the second dummy cell region 122 by a distance L. The distance L is longer than the minimum feature size. The activation region 1D3 included in the activation region group AR1 is apart from the activation region 1D3 included in the activation region group AR2 by the distance L.

The peripheral circuit region 200 includes an activation region 1P. The activation region 1P is apart from the activation region 1D2 included in the activation region group AR2 by a distance L' (L'>L).

Figure 6:
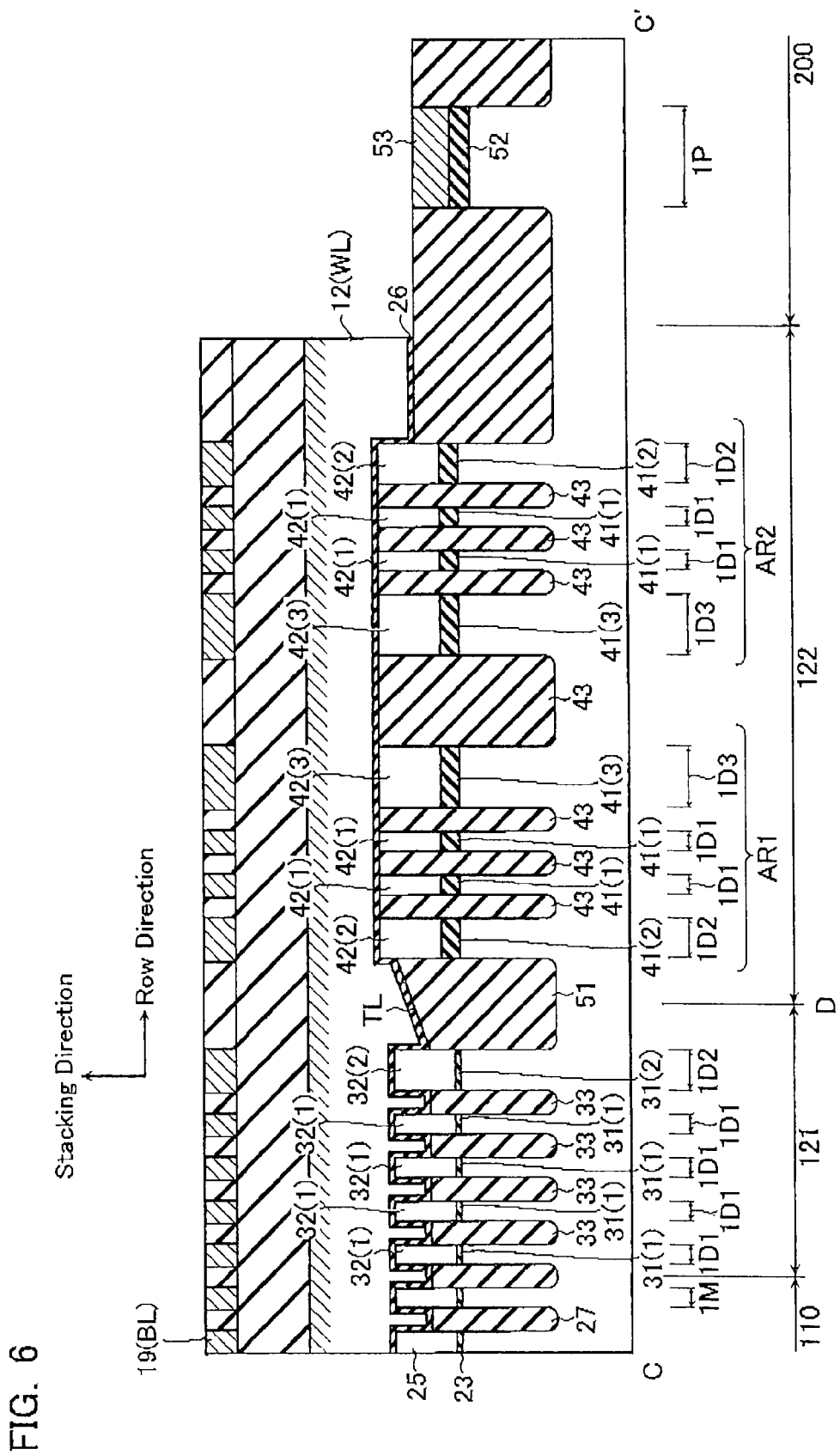
FIG. 6 is a cross sectional diagram showing a first dummy cell region 121, a second dummy cell region 122, and a peripheral circuit region 200 according to the first embodiment.

Next, the stacked structure of the first dummy cell region 121, the second dummy cell region 122, and the peripheral circuit region 200 will be explained with reference to FIG. 6. FIG. 6 is a cross-sectional diagram of FIG. 5 taken along a line C-C'.

As shown in FIG. 6, the first dummy cell region 121 includes a tunnel insulation layer 31(1) and a floating electrode layer 32(1) in each of its activation regions 1D1. The floating electrode layer 32(1) forms a first dummy cell. The first dummy cell region 121 includes a tunnel insulation layer 31(2) and a floating electrode layer 32(2) in its activation region 1D2. The floating electrode layer 32(2) forms a second dummy cell. When the tunnel insulation layers 31(1) and 31(2) are referred to generically, they are described as tunnel insulation layers 31 without parenthesized numerals (1) and (2). Likewise, when the floating electrode layers 32(1) and 32(2) are referred to generically, they are described as floating electrode layers 32 without parenthesized numerals (1) and (2).

The tunnel insulation layers 31 are formed on the semiconductor substrate 10. The row direction width of the tunnel, insulation layer 31(2) is larger than the row direction width of the tunnel insulation layers 31(1). The tunnel insulation layers 31 are formed on the same layer as the gate insulation layers 22 and 24 and the tunnel insulation layers 23 within the memory cell array region 110. The tunnel insulation layers 31 are formed by dividing layers formed on the semiconductor substrate 10.

The floating electrode layers 32 are formed on the tunnel insulation layers 31. The row direction width of the floating electrode layer 32(2) is larger than the row direction width of the floating electrode layers 32(1). The floating electrode layers 32 are formed on the same layer as the floating electrode layers 25 within the memory cell array region 110. The floating electrode layers 32(1) and 32(2) are formed by dividing layers formed on the semiconductor substrate 10.

As shown in FIG. 6, the first dummy cell region 121 also includes element isolation insulation layers 33 which adjoin the floating electrode layers 32 and electrically isolates the activation regions 1D1 and 1D2 (the first dummy cells) from one another. The top surfaces of the element isolation insulation layers 33 are located at a height lower than the top surfaces of the floating electrode layers 32, and the bottom surfaces thereof are located at a certain depth from the surface of the semiconductor substrate 10. The element isolation insulation layers 33 are made of silicon oxide mainly.

As shown in FIG. 6, the second dummy cell region 122 includes a tunnel insulation layer 41(1) and a floating electrode layer 42(1) in each of its activation regions 1D1. The second dummy cell region 122 includes a tunnel insulation layer 41(2) and a floating electrode layer 42(2) in each of its activation regions 1D2. The second dummy cell region 122 includes a tunnel insulation layer 41(3) and a floating electrode layer 92(3) in each of its activation regions 1D3. When the tunnel insulation layers 41(1) to 41(3) are referred to generically, they are described as tunnel insulation layers 41 without parenthesized numerals (1) to (3). Likewise, when the floating electrode layers 42(1) to 42(3) are referred to generically, they are described as floating electrode layers 42 without parenthesized numerals (1) to (3).

The tunnel insulation layers 41 are formed on the semiconductor substrate 10. The row direction width of the tunnel insulation layer 41(2) is larger than the row direction width of the tunnel insulation layer 41(1), and the row direction width of the tunnel insulation layer 41(3) is larger than the row direction width of the tunnel insulation layer 41(2). The thickness of the tunnel insulation layer 41 is larger than the thickness of the tunnel insulation layers 23 and 31. The bottom surfaces of the tunnel insulation layers 41 are located at the same height as the lower surfaces of the tunnel insulation layers 23 and 31. The tunnel insulation layers 41(1) to 41(3) are formed by dividing layers formed on the semiconductor substrate 10.

The floating electrode layers 42 are formed on the tunnel insulation layers 41. The row direction width of the floating electrode layers 42(2) is larger than the row direction width of the floating electrode layers 42(1), and the row direction width of the floating electrode layers 42(3) is larger than the row direction width of the floating electrode layers 42(2). The thickness of the floating electrode layers 42 is the same as the thickness of the floating electrode layers 25 and 32. The floating electrode layers 42(1) to 42(3) are formed by dividing layers formed on the semiconductor substrate 10.

As shown in FIG. 6, the second dummy cell region 122 also includes element isolation insulation layers 43 which adjoin the floating electrode layers 42 and electrically isolate the activation regions 1D1 to 1D3 (the second dummy cells) from one another. The top surfaces of the element isolation insulation layers 43 are located at the same height as the top surfaces of the floating electrode layers 42, and the bottom surfaces thereof are located at a certain depth from the surface of the semiconductor substrate 10. The element isolation insulation layers 43 are made of silicon oxide.

The first dummy cell region 121 and the second dummy cell region 122 include an element isolation insulation layer 51, and the block insulation layers 26 and the word line conductive layers 12 extending from the memory cell array region 110.

The element isolation insulation layer 51 is located at the boundary D between the first dummy cell region 121 and the second dummy cell region 122. The element isolation insulation layer 51 electrically isolates the first dummy cell region 121 (first dummy cell) and the second dummy cell region 122 (second dummy cell) from each other. An end portion, adjoining the floating electrode layer 32(2), of the top surface of the element isolation insulation layer 51 is located at a height lower than the top surface of the floating electrode layer 32(2). An end portion, adjoining the floating electrode layer 42(2), of the top surface of the element isolation insulation layer 51 is located at a height slightly lower than the top surface of the floating electrode layer 42(2) (or at a height higher than the top surface of the floating electrode layer 32(2)). The top surface of the element isolation insulation layer 51 has a gradient TL that ascends from the side surface of the floating electrode layer 32(2) toward the side surface of the floating electrode layer 42(2). The end portion, adjoining the floating electrode layer 42(2), of the top surface of the element isolation insulation layer 51 may be located at the same height as the top surface of the floating electrode layer 42(2).

The block insulation layer 26 is formed on the floating electrode layers 32 and 42 and the element isolation insulation layers 33, 43, and 51. The word line conductive layer 12 is formed to cover the floating electrode layers 32 and 42 and the element isolation insulation layers 33, 43, and 51 through the block insulation layer 26.

As shown in FIG. 6, the peripheral circuit region 200 includes a gate insulation layer 52 and a conductive layer 53 in the activation region 1P. The gate insulation layer 52 is formed on the semiconductor substrate 10 and on the same layer as the tunnel insulation layers 41 to have the same thickness as the tunnel insulation layers 41. The conductive layer 53 is formed on the gate insulation layer 52. The conductive layer 53 functions as the gates of the transistors of the peripheral circuits, and the semiconductor substrate 10 located immediately under the conductive layer 53 functions as the channel of the transistors of the peripheral circuits. The dielectric strength of the transistors in the peripheral circuit region 200 is set higher than the dielectric strength of the transistors in the memory cell array region 110 because of the thickness of the gate insulation layer 52.

[Manufacturing Method]

Next, a method of manufacturing a nonvolatile semiconductor memory device according to the first embodiment will be explained with reference to FIG. 7A to FIG. 7K. FIG. 7A to FIG. 7K show the first dummy cell region 121 and the second dummy cell region 122.

First, as shown in 7A, an insulation layer 31A is formed on the semiconductor substrate 10 within the first and second dummy cell regions 121 and 122. A resist pattern 60 is formed on the insulation layer 31A. The resist pattern 60 is formed within the second dummy cell region 122, and not within the first dummy cell region 121.

Next, as shown in FIG. 7B, wet etching using the resist pattern 60 as a mask is carried out to remove the insulation layer 31A within the first dummy cell region 121. At this time, because wet etching is isotropic, also the insulation layer 31A under the end portion of the resist pattern 60 is slightly removed. As a result, the surface of the semiconductor substrate 10 is exposed within the first dummy cell region 121.

Figure 7A:
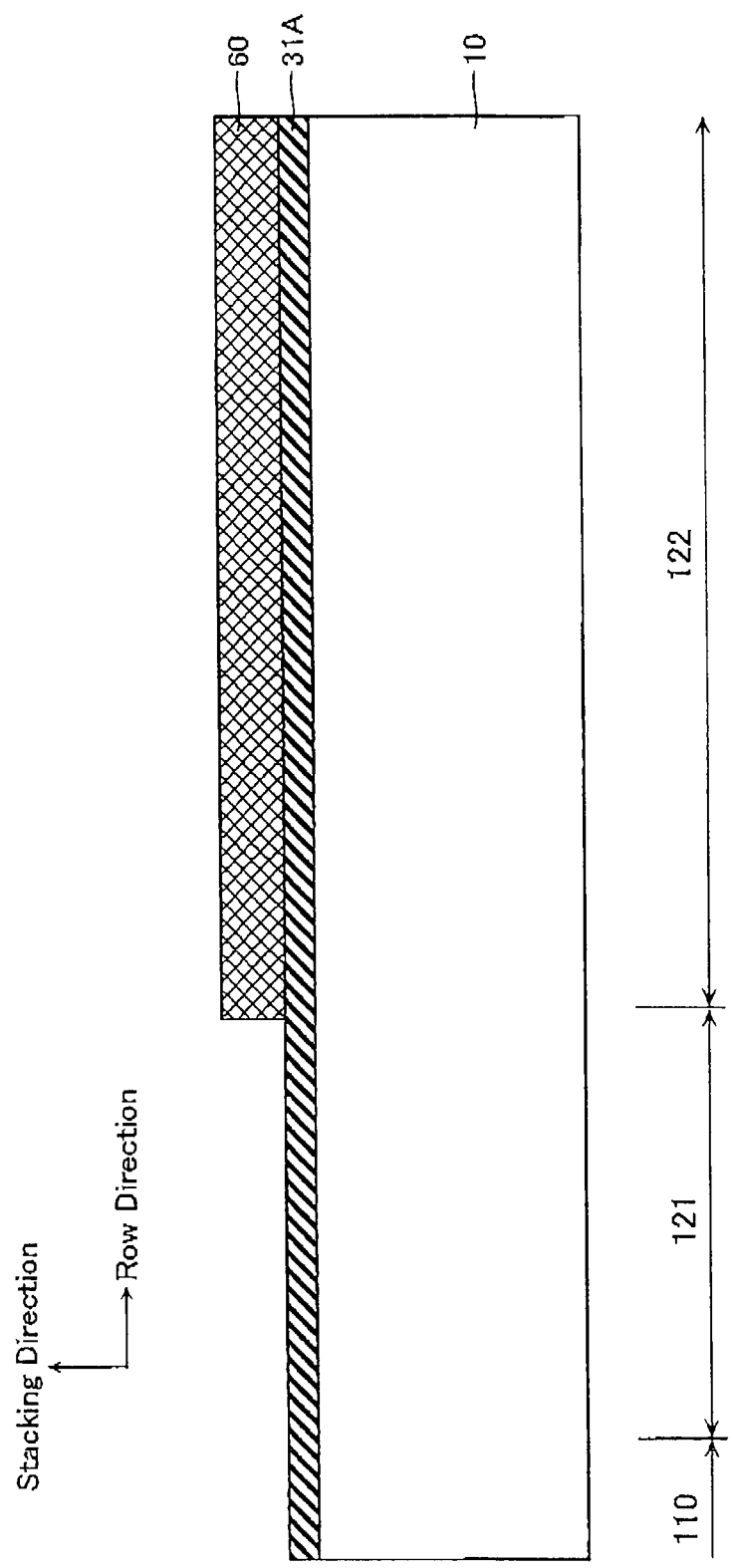
FIG. 7A is a diagram showing a step of manufacturing the nonvolatile semiconductor memory device according to the first embodiment.
Figure 7C:
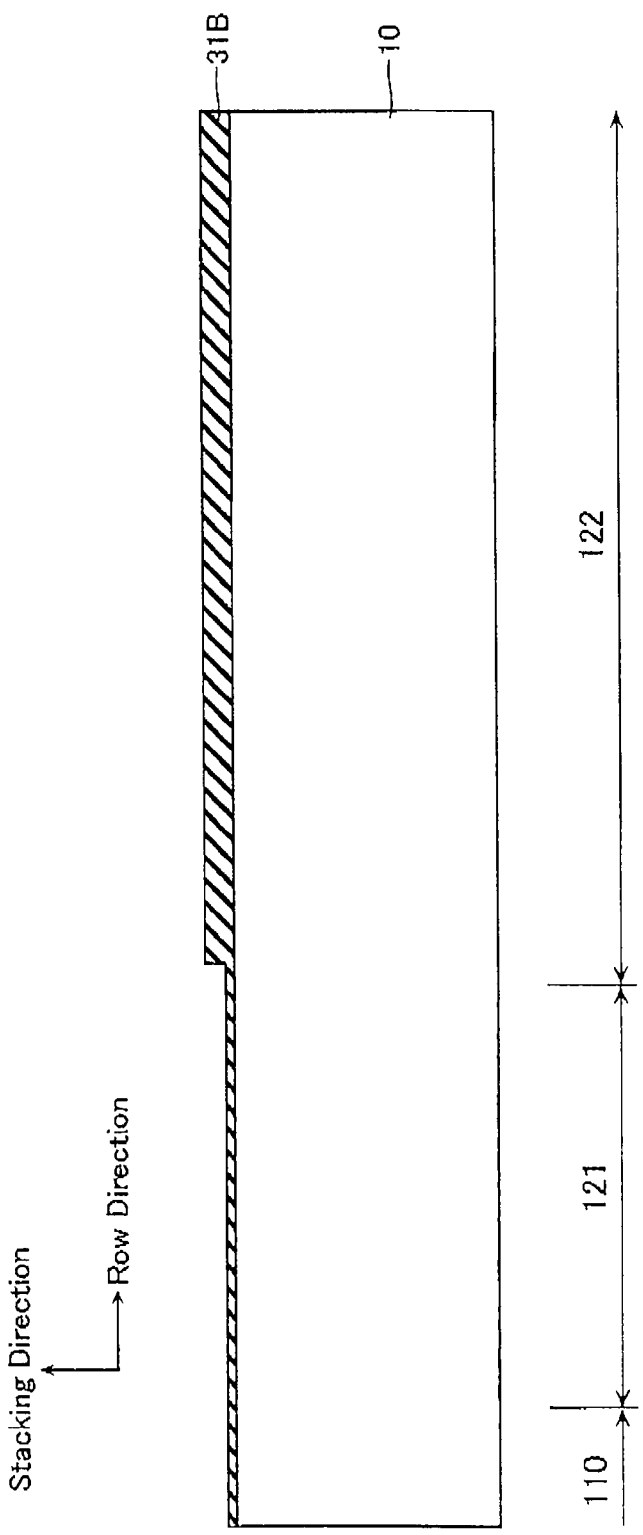
FIG. 7C is a diagram showing a step of manufacturing the nonvolatile semiconductor memory device according to the first embodiment.

Then, as shown in FIG. 7C, after the resist pattern 60 is removed, the surface of the semiconductor substrate 10 is oxidized. Hence, an insulation layer 31B is formed all across the first and second dummy cell regions 121 and 122. The thickness of the insulation layer 31B within the second dummy cell region 122 is larger than the thickness of the insulation layer 31B within the first dummy cell region 121.

Figure 7D:
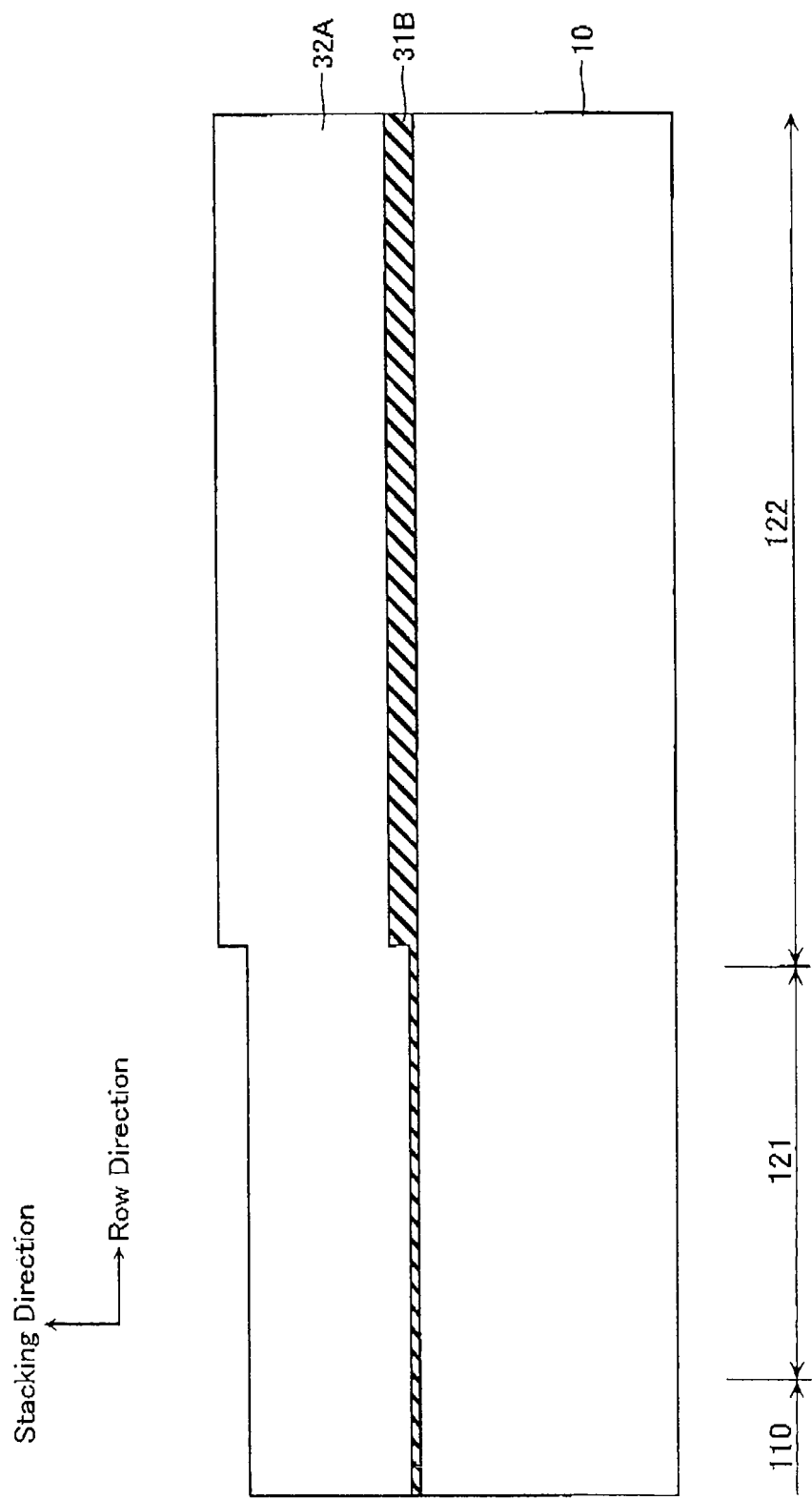
FIG. 7D is a diagram showing a step of manufacturing the nonvolatile semiconductor memory device according to the first embodiment.

Next, as shown in FIG. 7D, polysilicon is deposited on the insulation layer 31B by a CVD process to form a polysilicon layer 32A.

Figure 7E:
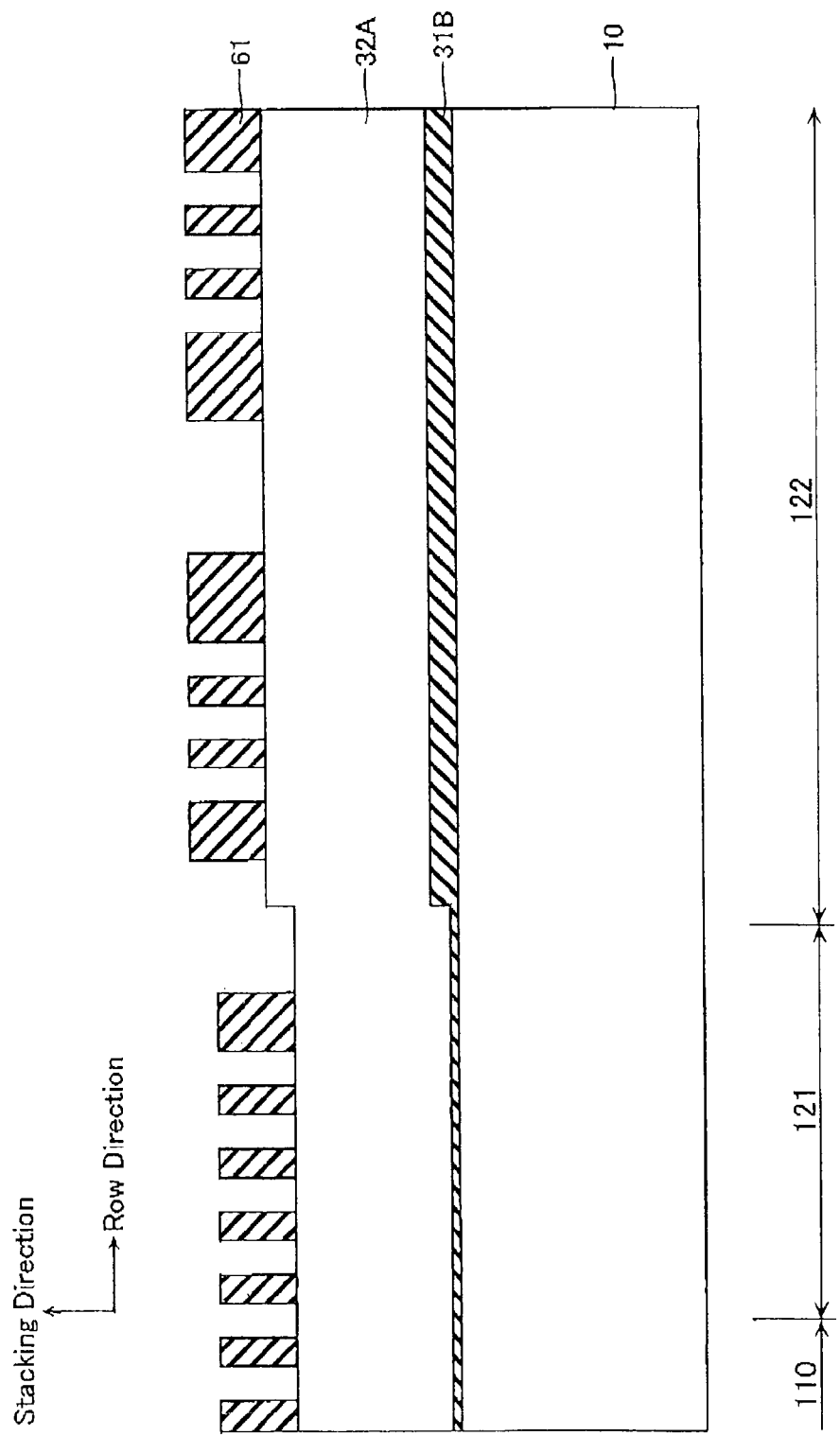
FIG. 7E is a diagram showing a step of manufacturing the nonvolatile semiconductor memory device according to the first embodiment.

Then, as shown in FIG. 7E, a resist pattern 61 is formed on the polysilicon layer 32A. Here, HMDS (adhesiveness enhancer) treatment is carried out in order to enhance the adhesiveness between the resist pattern 61 and the polysilicon layer 32A. For example, HMDS treatment is carried out for, for example, 60 seconds.

Figure 7F:
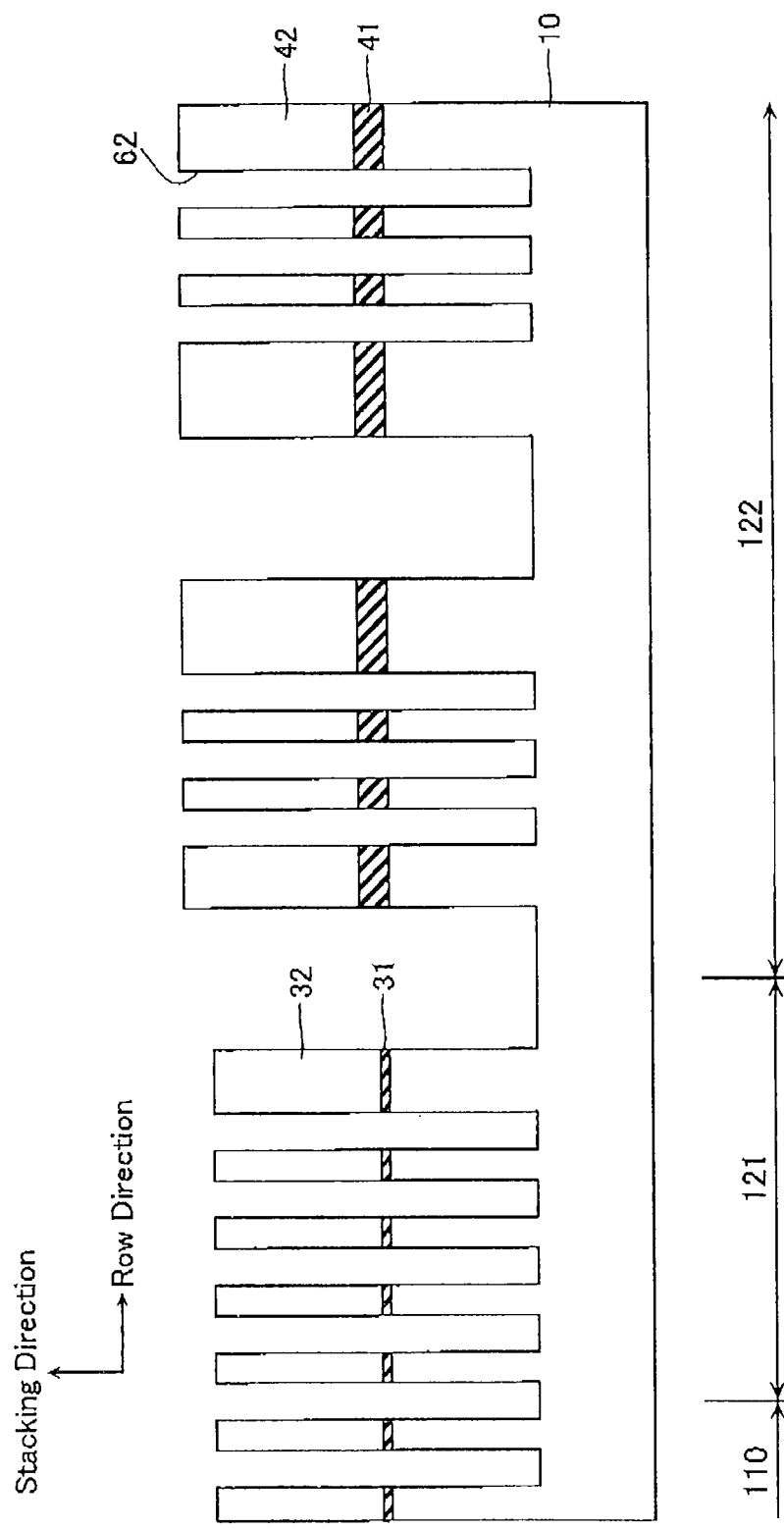
FIG. 7F is a diagram showing a step of manufacturing the nonvolatile semiconductor memory device according to the first embodiment.

Next, as shown in FIG. 7F, dry etching using the resist pattern 61 as a mask is carried out to form grooves 62. The grooves 62 divide the insulation layer 31B and the polysilicon layer 32A and form tunnel insulation layers 31 and 41 and floating electrode layers 32 and 42. The grooves 62 are also formed to dig into the semiconductor substrate 10. The resist pattern 61 is removed after the dry etching.

Figure 7G:
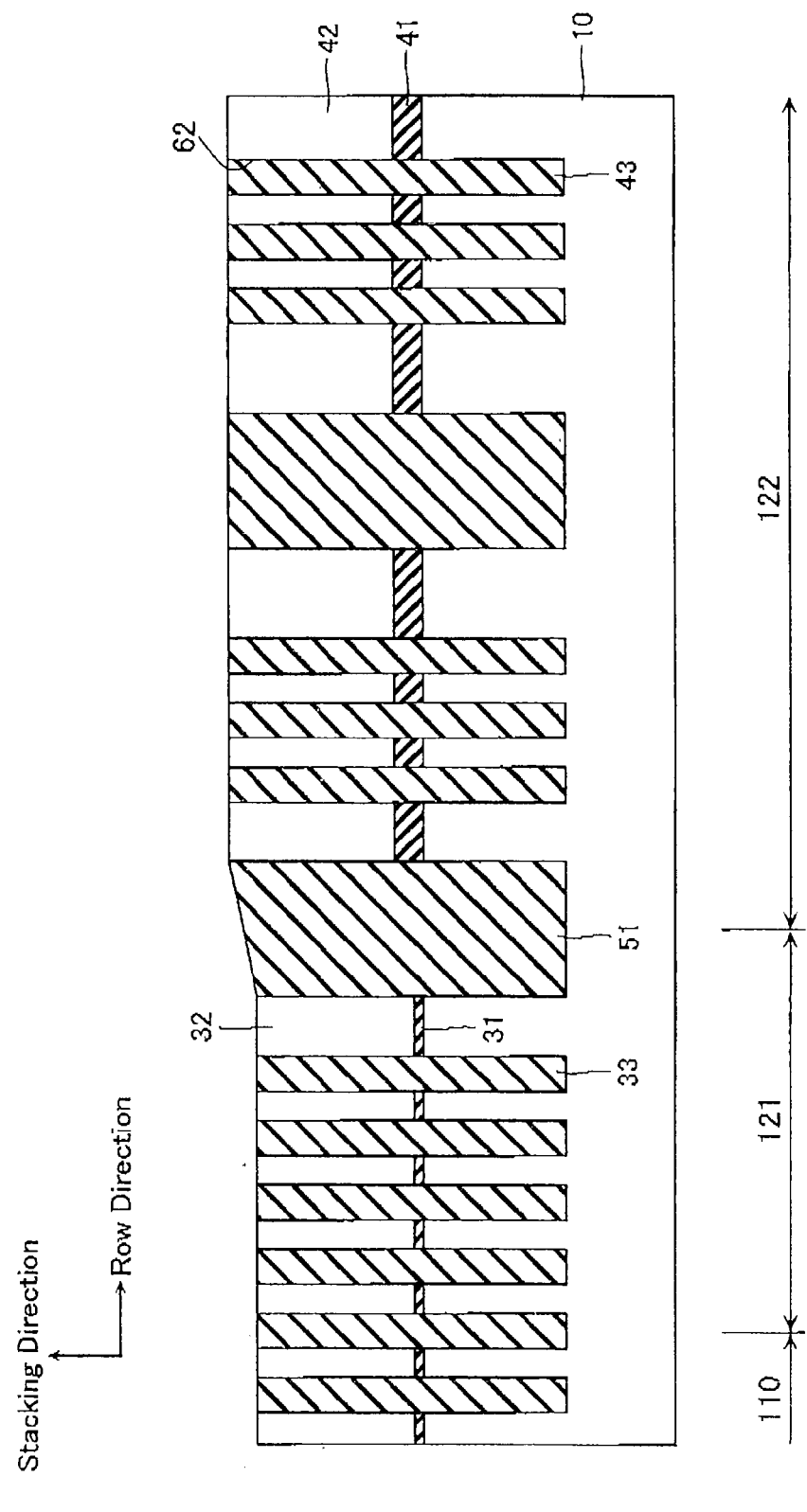
FIG. 7G is a diagram showing a step of manufacturing the nonvolatile semiconductor memory device according to the first embodiment.

Then, as shown in FIG. 7G, element isolation insulation layers 33, 43 and 51 are formed to fill the grooves 62. The element isolation insulation layers 33, 43, and 51 are made of any of polysilazane (organic coated film), a TEOS film (a film formed by CVD including eHARP™), and HDP (a film formed by plasma CVD). A CMP process is carried out to polish the element isolation insulation layers 33, 43, and 51 and expose the top surfaces of the floating electrode layers 32 and 42.

Figure 7H:
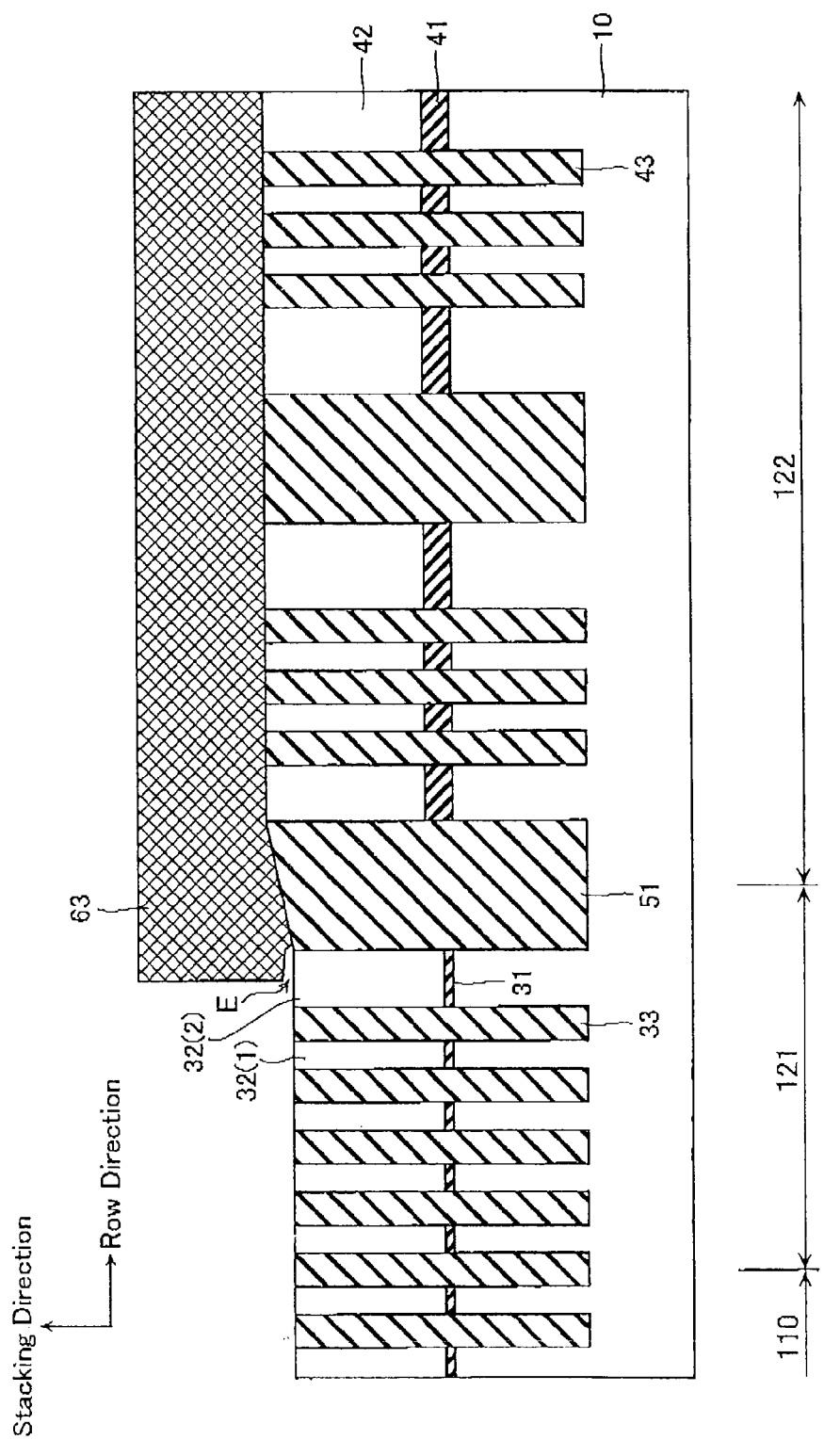
FIG. 7H is a diagram showing a step of manufacturing the nonvolatile semiconductor memory device according to the first embodiment.

Then, as shown in FIG. 7H, a resist pattern 63 is formed to cover the whole of the second dummy cell region 122 and a part of the floating electrode layer 32(2) at the end portion of the first dummy cell region 121.

Figure 7I:
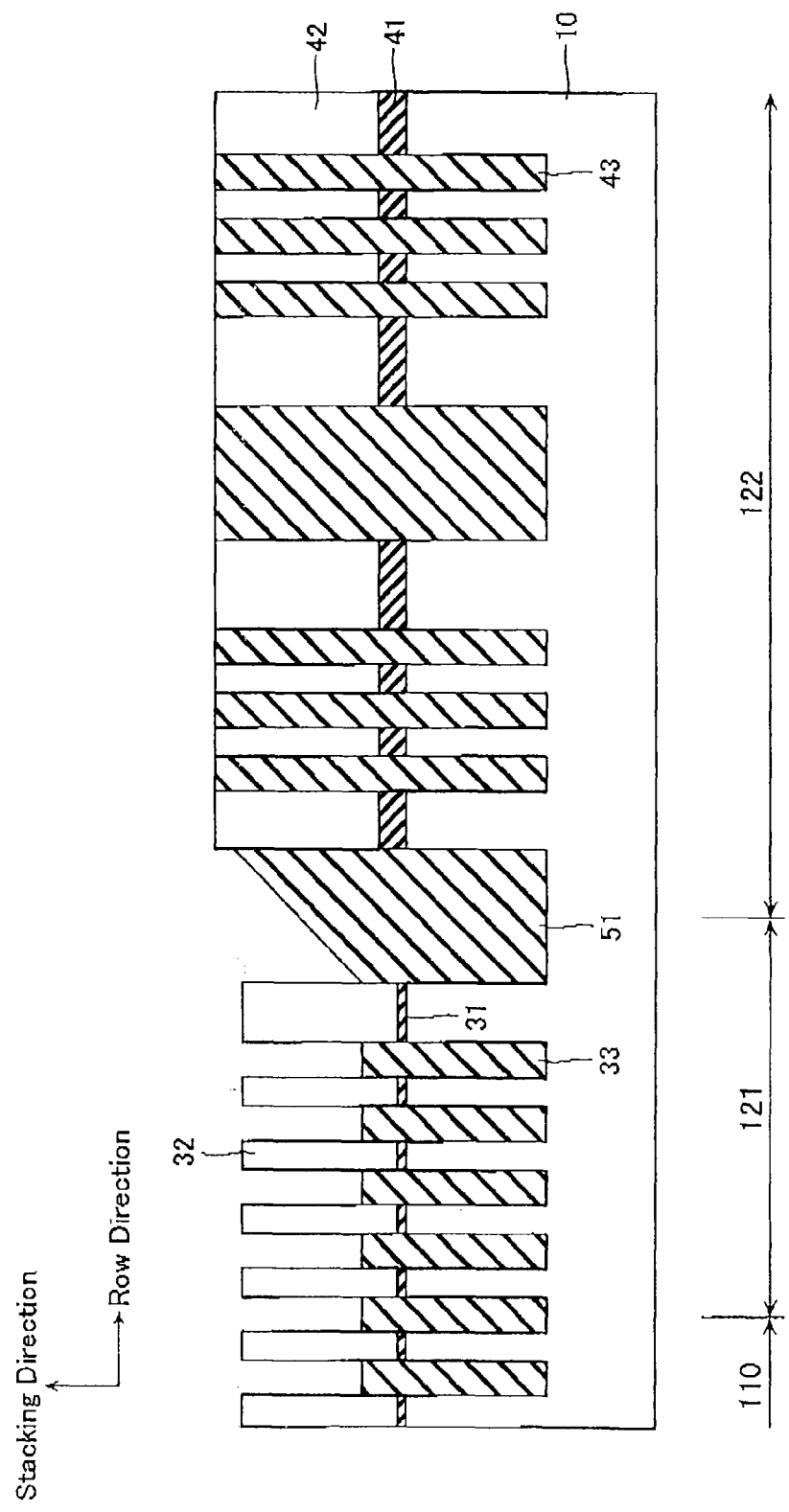
FIG. 7I is a diagram showing a step of manufacturing the nonvolatile semiconductor memory device according to the first embodiment.

Next, as shown in FIG. 7I, wet etching using the resist pattern 63 as a mask is carried out to etch back the element isolation insulation layers 33 within the first dummy cell region 121. As a result, the top surfaces of the element isolation insulation layers 33 come to be located at a height lower than the top surfaces of the floating electrode layers 32. On the other hand, the element isolation insulation layers 43 within the second dummy cell region 122 are not etched back because the resist pattern 63 is formed thereon. The chemical used for the wet etching penetrates into the element isolation insulation layer 51 through a clearance E (see FIG. 7H) formed between the floating electrode layer 32(2) and the resist pattern 63. Hence, the closer to the first dummy cell region 121 the top surface of the element isolation insulation layer 51 is, the more downward it recedes. After the wet etching, the resist pattern 63 is removed.

For example, when the chemical used for the wet etching in the step shown in FIG. 7I is "BHF170AU", the wet etching is carried out for 100 to 170 seconds. When the chemical is "BHF 63AU", the wet etching is carried out for 50 to 85 seconds. The chemical may be "BHF115AS2" or "DHF (diluted hydrofluoric acid)".

Figure 7J:
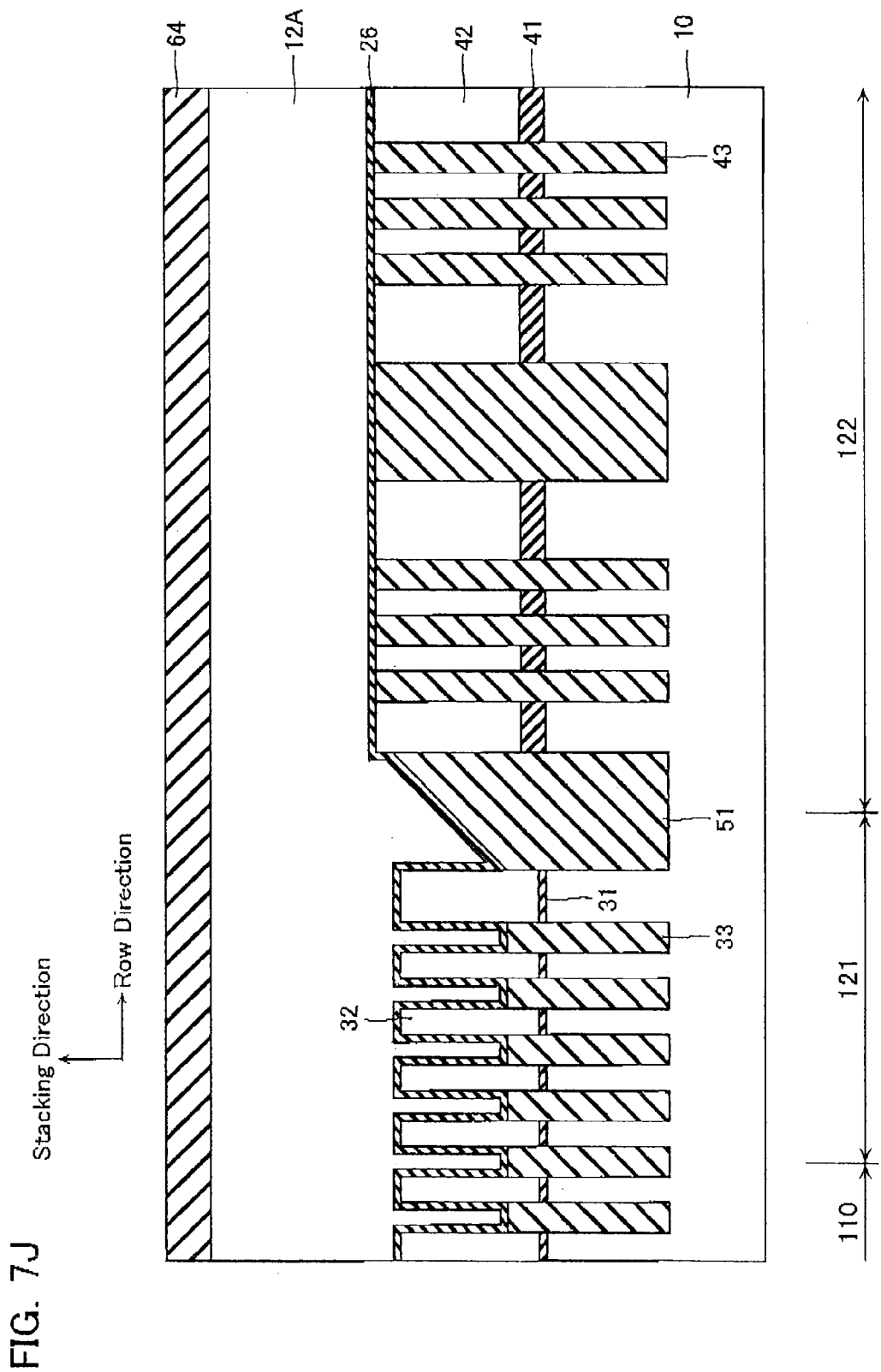
FIG. 7J is a diagram showing a step of manufacturing the nonvolatile semiconductor memory device according to the first embodiment.

Then, as shown in FIG. 7J, a block insulation layer 26 is formed to cover the floating electrode layers 32, 42, and 51. Furthermore, polysilicon is deposited on the block insulation layer 26 to form a polysilicon layer 12A. A protection layer 64 is formed on the polysilicon layer 12A. The protection layer 64 serves the function in manufacturing the gates of the memory transistors MT, etc.

Figure 7K:
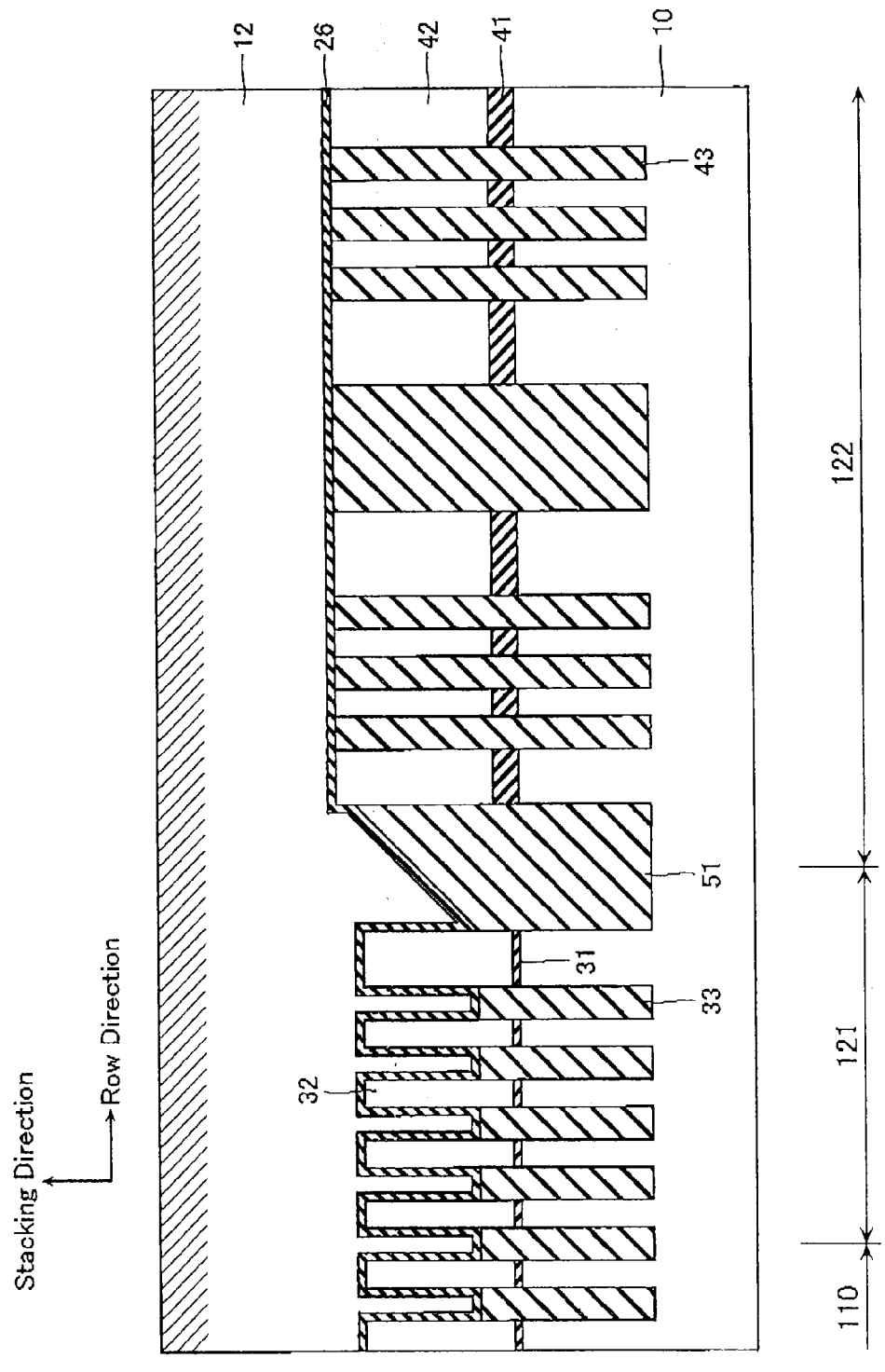
FIG. 7K is a diagram showing a step of manufacturing the nonvolatile semiconductor memory device according to the first embodiment.

Next, as shown in FIG. 7K, after the protection layer 64 is removed by CMP, the polysilicon layer 12A is silicided to form word line conductive layers 12.

[Advantage]

Figure 8A:
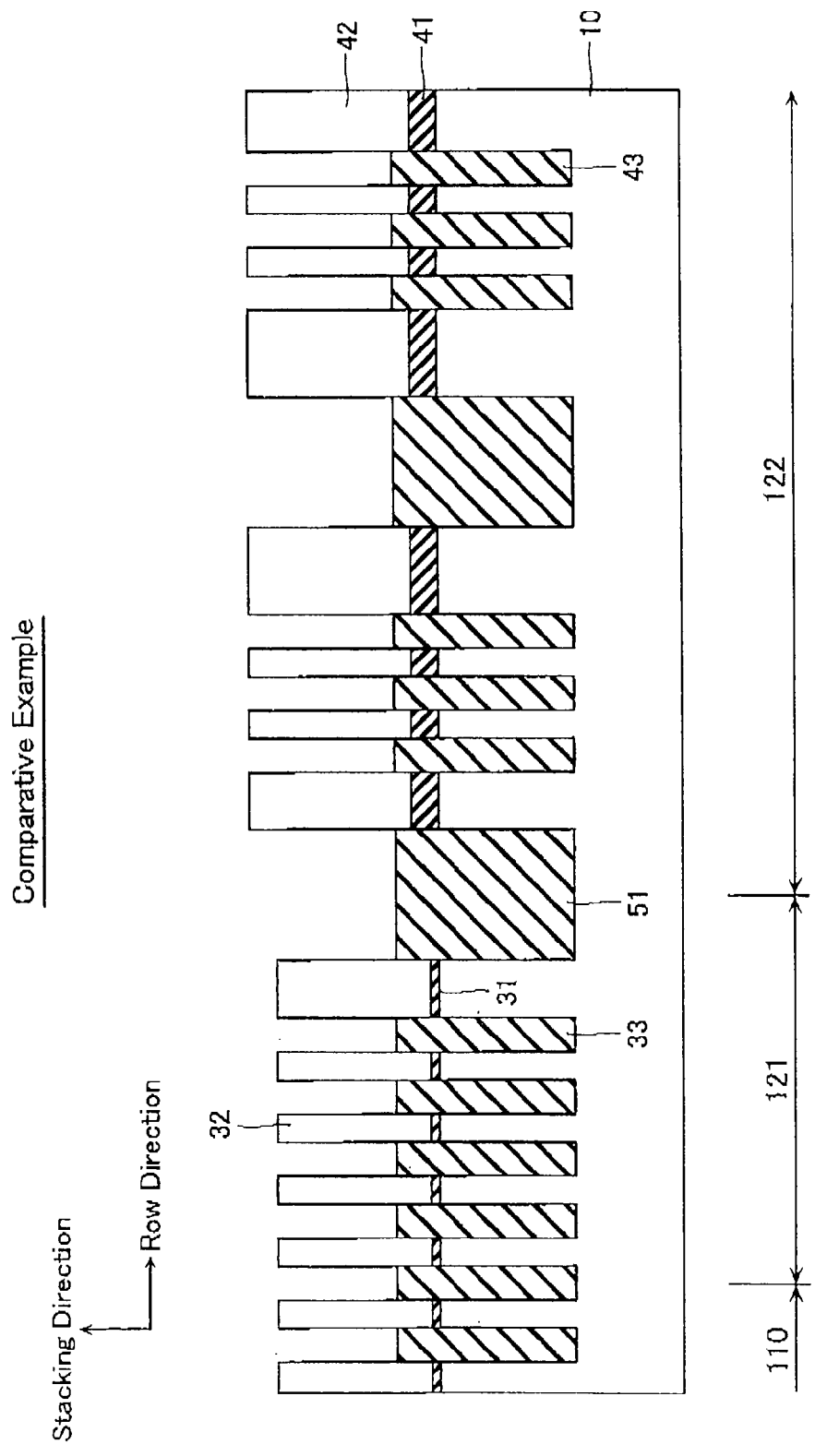
FIG. 8A is a diagram showing a step of manufacturing a nonvolatile semiconductor memory device according to a comparative example.

Next, the advantage of the first embodiment will be explained with reference to FIG. 8A to FIG. 8C based on comparison between the first embodiment and a comparative example. As shown in FIG. 8A, in the comparative example, the top surface of the element isolation insulation layer 51 is formed in parallel with the semiconductor substrate 10 and located at a height lower than the top surfaces of the floating electrode layers 32 and 42. Further, in the comparative example, the top surfaces of the element isolation insulation layers 43 are located at a height lower than the top surfaces of the floating electrode layers 42.

In the comparative example described above, as shown in FIG. 8B, the polysilicon layer 12A and the protection layer 64 formed above the element isolation insulation layers 43 and 51 become dented largely (see dents G). Due to this, as shown in FIG. 8C, the protection film 64 remains in the dents G even after it is polished by CMP. Therefore, when studding the polysilicon layer 12A to form the word line conductive layers 12, the resistance value of the word line conductive layers 12 (word lines WL) becomes high in proportion to the volume of the remaining protection layer 64.

As compared with this, in the first embodiment, the top surfaces of the element isolation insulation layers 43 are located at the same height as the top surfaces of the floating electrode layers 42 as shown in FIG. 7I. Furthermore, in the first embodiment, the top surface of the element isolation insulation layer 51 has a gradient TL. Therefore, no such large dents G as in the comparative example occur to leave no protection layer 64 after the CMP (see FIG. 7J and FIG. 7K). That is, the first embodiment can suppress the resistance value of the word line conductive layers 12 lower than that of the comparative example.

Figure 9:
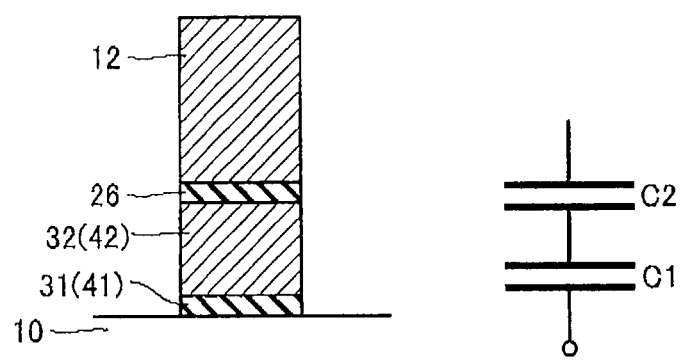
FIG. 9 is a schematic diagram showing a coupling ratio C3.

Next, a coupling ratio C3 required of the first and second dummy cell regions 121 and 122 will be explained with reference to FIG. 9. When a high voltage is applied to the tunnel insulation layers 31 and 41 within the first dummy cell region 121 and the second dummy cell region 122, an electric field to be applied to the tunnel insulation layers 31 and 41 gives adverse effects on the memory cell array region 110. For example, there occurs a larger leak current in the memory cell array region 110. Hence, it is necessary to set a high coupling ratio C3 in the first and second dummy cell regions 121 and 122 in order to be able to withstand a high voltage.

The coupling ratio C3 is given by (Equation 1) shown below (see FIG. 9).

$$C3 = C2/(C1+C2) \qquad \text{(Equation 1)}$$

C3: coupling ratio

C1: capacitance between the semiconductor substrate 10 and the floating electrode layer 32 (42)

C2: capacitance between the word line conductive layer 12 and the floating electrode layer 32 (42)

Here, in the first embodiment, the tunnel insulation layers 41 within the second dummy cell region 122 are formed thicker than the tunnel insulation layers 31 within the first dummy cell region 121 (see FIG. 6). That is, the capacitance C1 within the second dummy cell region 122 is set smaller than the capacitance C1 within the first dummy cell region 121, enabling to suppress reduction of the coupling ratio C3 within the second dummy cell region 122.

On the other hand, in the present embodiment, the first dummy cell region 121 has a capacitance C1 larger than that of the second dummy cell region 122. Therefore, it is necessary to compensate for reduction of the coupling ratio C3 by some means. Hence, within the second dummy cell region 122, the top surfaces of the element isolation insulation layers 43 may be formed at the same height as the top surfaces of the floating electrode layers 42. On the other hand, within the first dummy cell region 121, the top surfaces of the element isolation insulation layers 33 are formed to be located at a height lower than the top surfaces of the floating electrode layers 32(1). Further, within the first dummy cell region 121, the top surface of the element isolation insulation layer 51 is formed to be located at a height lower than the top surface of the floating electrode layer 32(2). Hence, the word line conductive layer 12 covers the floating electrode layers 42 on the top surfaces thereof within the second dummy cell region 122, while it covers the floating electrode layers 32 on the top surfaces and side surfaces thereof within the first dummy cell region 121. Therefore, the area of the word line conductive layer 12 in which it faces the floating electrode layers 32 is larger than the area of the word line conductive layer 12 in which it faces the floating electrode layers 42. That is, the capacitance C2 within the first dummy cell region 121 is set larger than the capacitance C2 within the second dummy cell region 122, thereby enabling to suppress reduction of the coupling ratio C3 within the first dummy cell region 121. Accordingly, the first embodiment can suppress deterioration of the device characteristics and also can suppress the resistance value of the word line conductive layer 12 low as described above.

Second Embodiment

[Configuration]

Next, the configuration of a nonvolatile semiconductor memory device according to the second embodiment will be explained with reference to FIG. 10. In the second embodiment, any components that are the same as the components in the first embodiment will be denoted by the same reference numerals and will not be explained redundantly.

Figure 10:
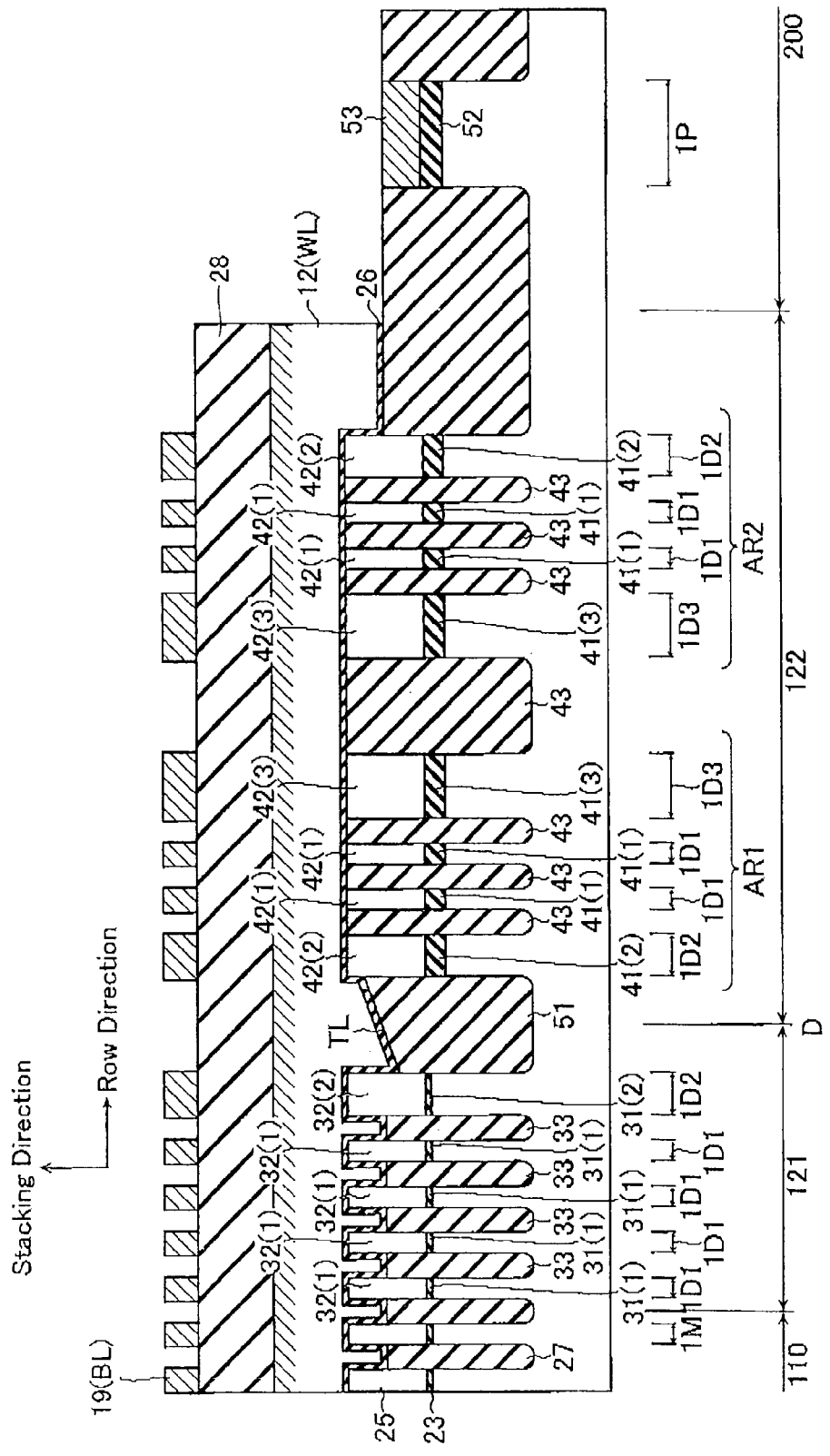
FIG. 10 is a cross sectional diagram showing a first dummy cell region 121, a second dummy cell region 122, and a peripheral circuit region 200 according to a second embodiment.

In the second embodiment, as shown in FIG. 10, the top surfaces of the tunnel insulation layers 31 are located at the same height as the top surfaces of the tunnel insulation layers 41. The top surfaces of the floating electrode layers 32 are located at the same height as the top surfaces of the floating electrode layers 92. On the other hand, the bottom surfaces of the tunnel insulation layers 31 are located at a height different from the bottom surfaces of the tunnel insulation layers 41. The second embodiment is different from the first embodiment in these points.

[Manufacturing Method]

Next, a method of manufacturing the nonvolatile semiconductor memory device according to the second embodiment will be explained with reference to FIG. 11A to FIG. 11I.

First, as shown in FIG. 11A, a resist pattern 70 is formed on the semiconductor substrate 10. The resist pattern 70 is formed within the first dummy cell region 121.

Figure 11B:
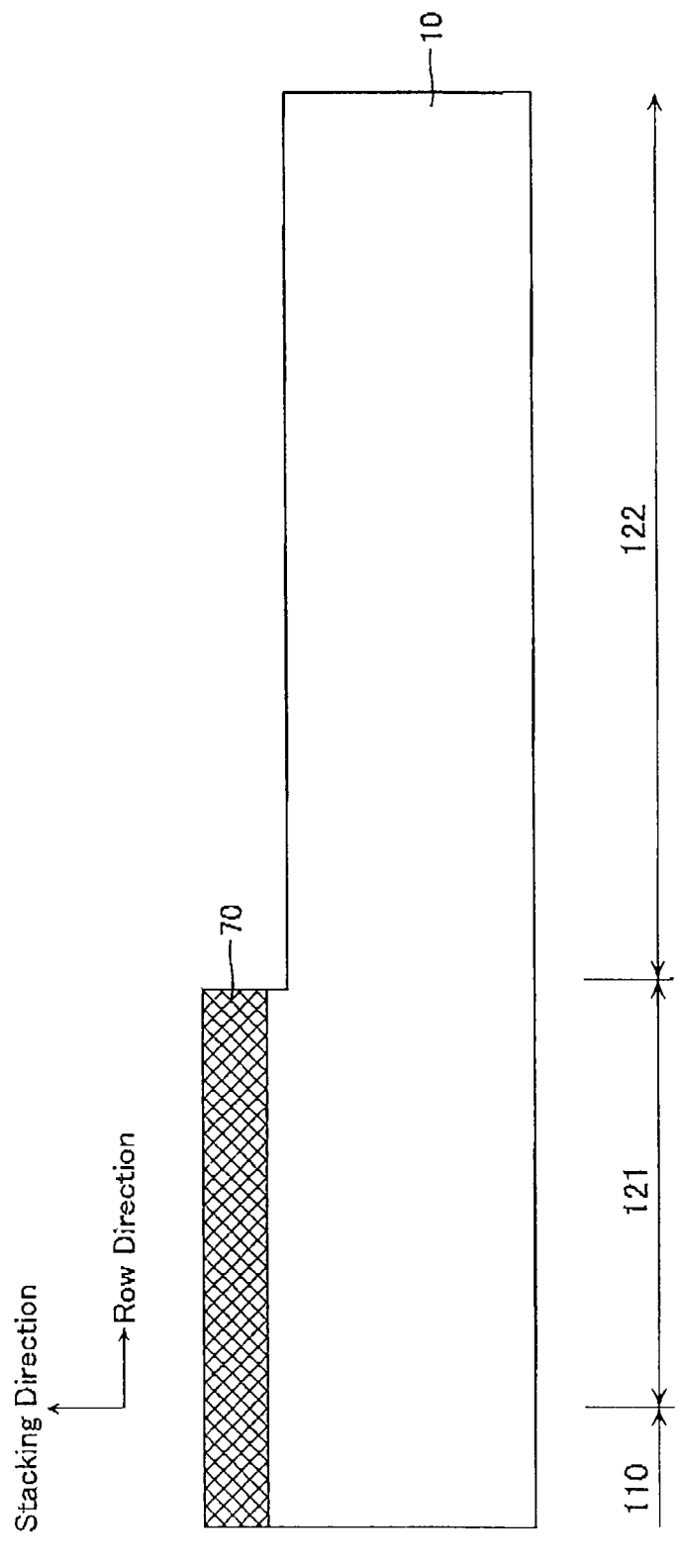
FIG. 11B is a diagram showing a step of manufacturing the nonvolatile semiconductor memory device according to the second embodiment.

Next, as shown in FIG. 11B, wet etching using the resist pattern 70 as a mask is carried out to dig down the semiconductor substrate 10 within the second dummy cell region 122. Then, as shown in FIG. 11C, an insulation layer 31C is formed on the semiconductor substrate 10.

Figure 11D:
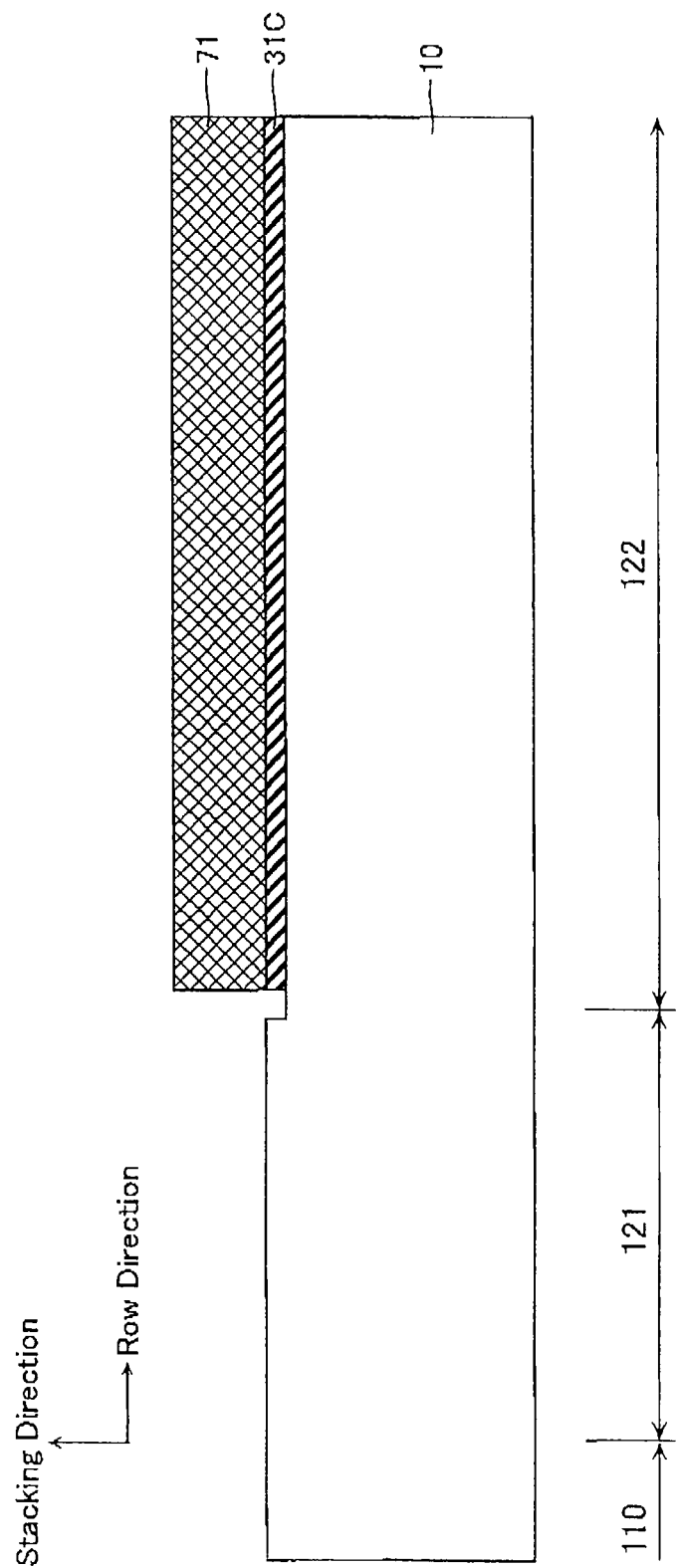
FIG. 11D is a diagram showing a step of manufacturing the nonvolatile semiconductor memory device according to the second embodiment.

Next, as shown in FIG. 11D, a resist pattern 71 is formed on the insulation layer 31C within the second dummy cell region 122. Then, etching using the resist pattern 71 as a mask is carried out to remove the insulation layer 31C within the first dummy cell region 121. After this, the resist pattern 71 is removed.

Figure 11E:
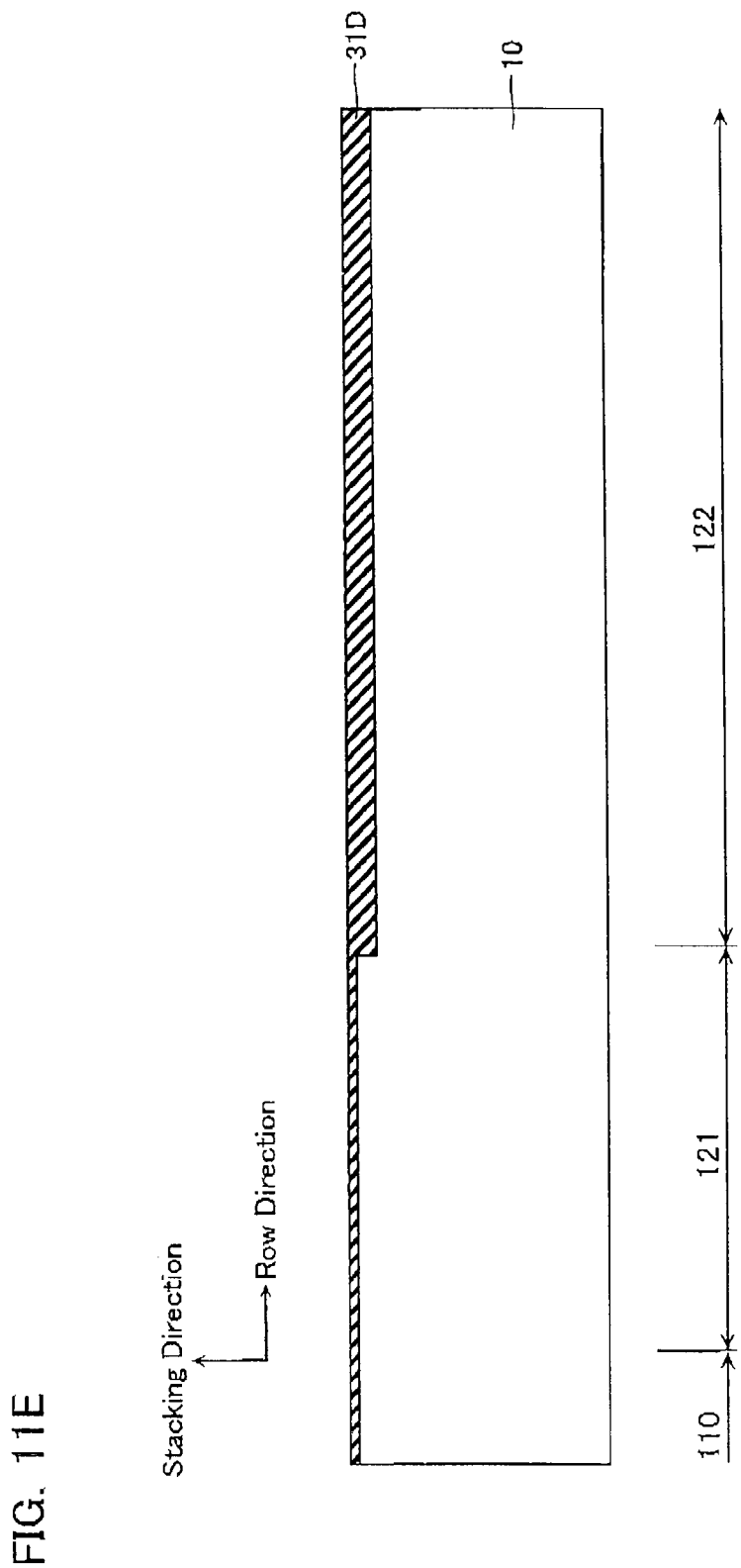
FIG. 11E is a diagram showing a step of manufacturing the nonvolatile semiconductor memory device according to the second embodiment.

Then, as shown in FIG. 11E, an insulation is formed over the semiconductor substrate 10 and the insulation layer 31C to form an insulation layer 31D. The thickness of the insulation layer 31D within the second dummy cell region 122 is larger than the thickness of the insulation layer 31D within the first dummy cell region 121.

Figure 11F:
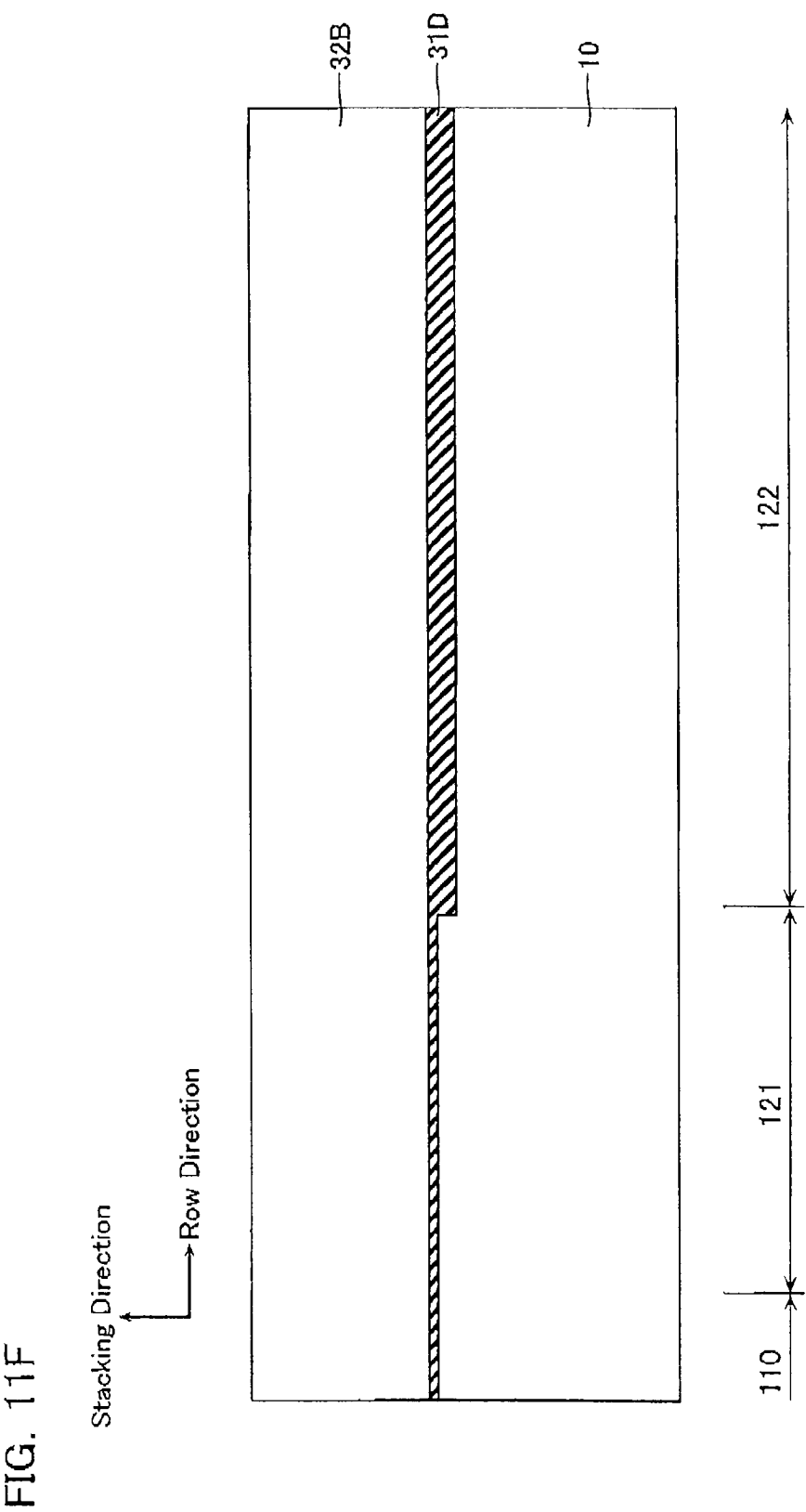
FIG. 11F is a diagram showing a step of manufacturing the nonvolatile semiconductor memory device according to the second embodiment.
Figure 11G:
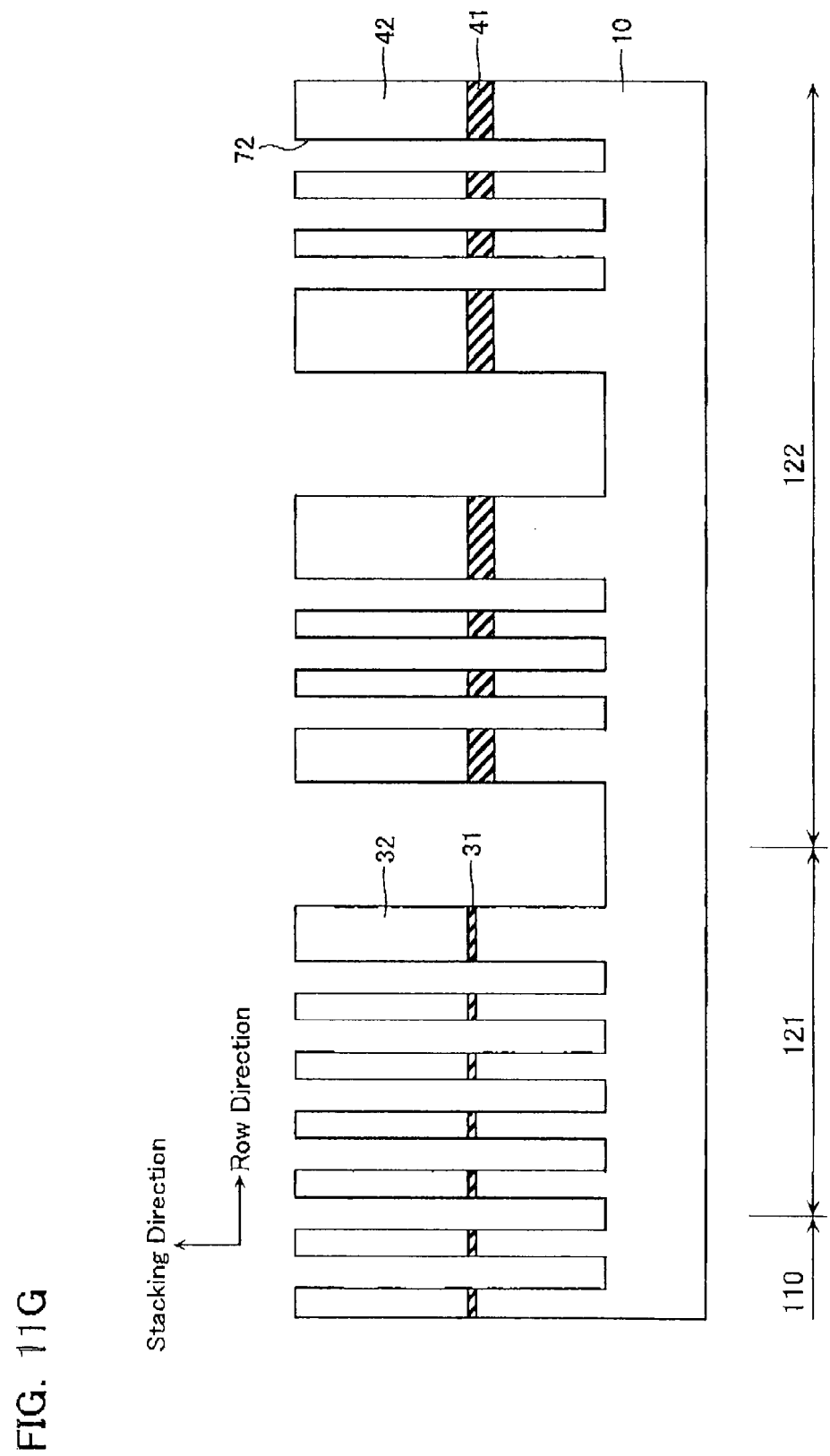
FIG. 11G is a diagram showing a step of manufacturing the nonvolatile semiconductor memory device according to the second embodiment.

Next, as shown in FIG. 11F, polysilicon is deposited on the insulation layer 31D to form a polysilicon layer 323. Then, as shown in FIG. 11G, dry etching is carried out to form grooves 72 that divide the insulation layer 31D and the polysilicon layer 32B and dig into the semiconductor substrate 10. The grooves 72 make the insulation layer 31D tunnel insulation layers 31 and 41 and make the polysilicon layer 32B floating electrode layers 32 and 42.

Figure 11H:
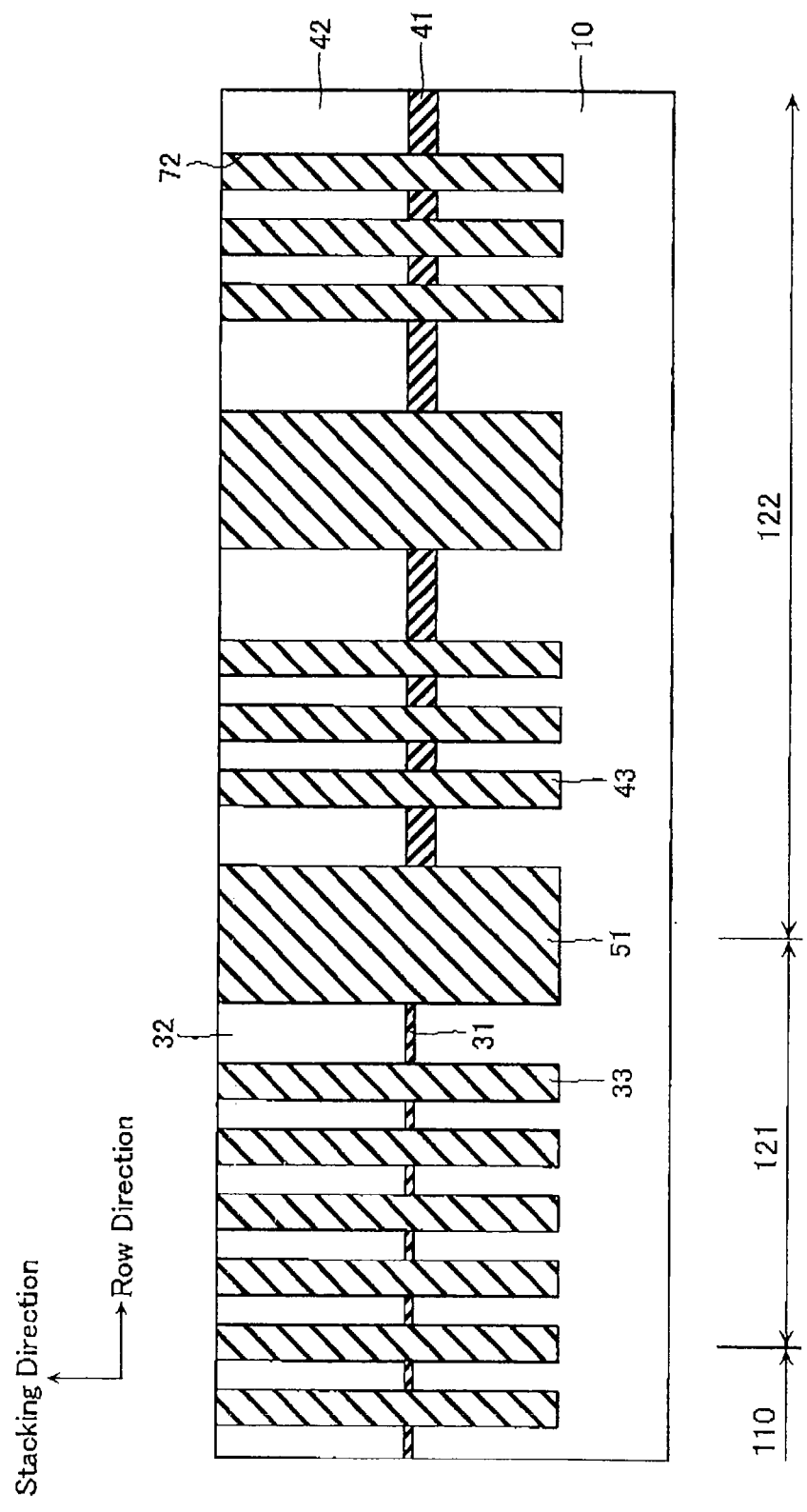
FIG. 11H is a diagram showing a step of manufacturing the nonvolatile semiconductor memory device according to the second embodiment.

Next, as shown in FIG. 11H, element isolation insulation layers 33, 43, and 51 are formed to fill the grooves 72. Then, a CMP process is carried out to polish the element isolation insulation layers 33, 43, and 51 and expose the top surfaces of the floating electrode layers 32 and 42.

Figure 11I:
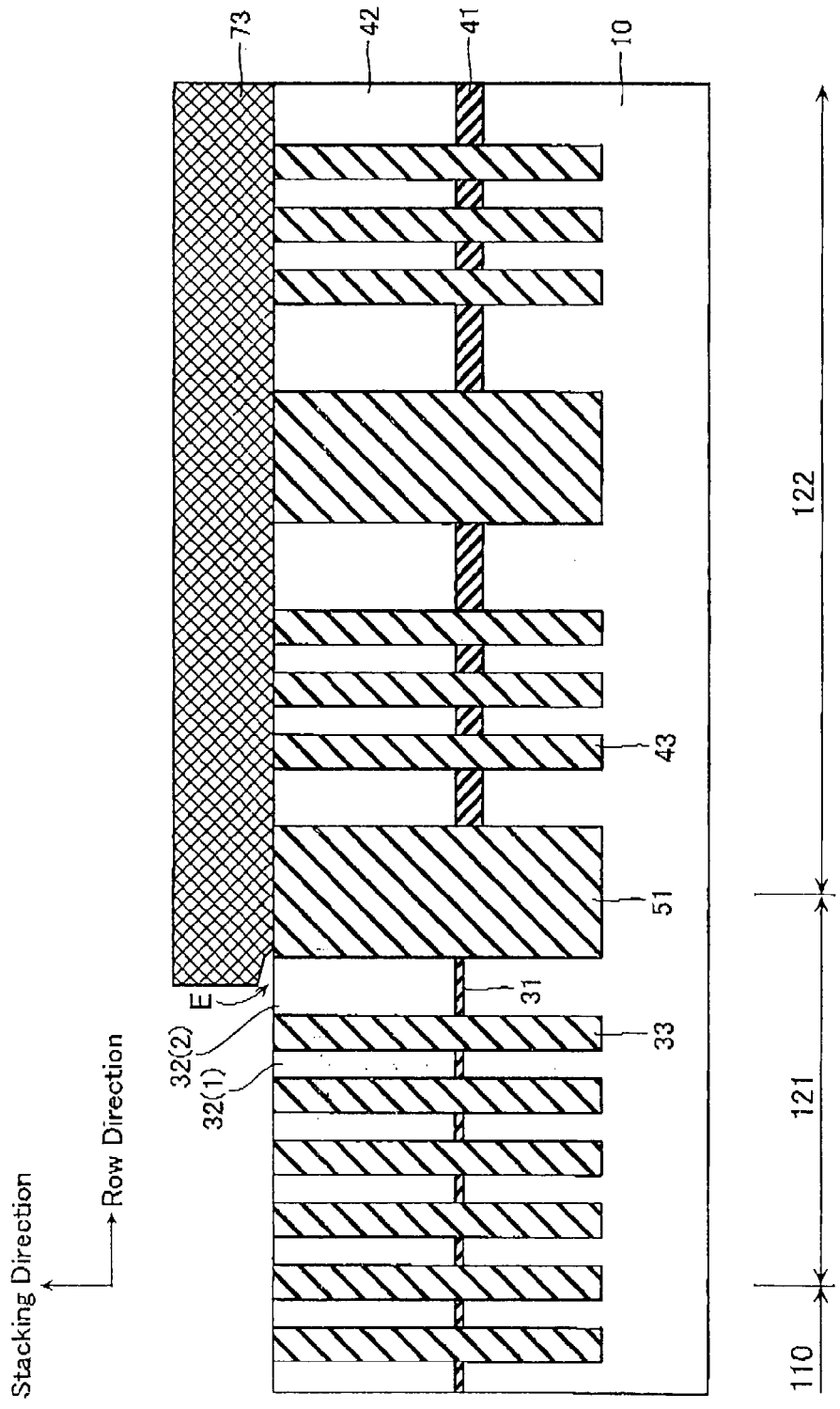
FIG. 11I is a diagram showing a step of manufacturing the nonvolatile semiconductor memory device according to the second embodiment.

Then, as shown in FIG. 11I, a resist pattern 73 is formed to cover the whole of the second dummy cell region 122 and a part of the floating electrode layer 32(2) within the first dummy cell region 121. After FIG. 11I, the same manufacturing steps as those of the first embodiment are carried out to form the nonvolatile semiconductor memory device according to the second embodiment.

[Advantage]

The second embodiment has a similar configuration to that of the first embodiment, and achieves similar advantages to those of the first embodiment. Furthermore, as shown in FIG. 11G mentioned above, the top surfaces of the floating electrode layers 32 are located at the same height as the top surfaces of the floating electrode layers 42. That is, there is no step difference between the first dummy cell region 121 and the second dummy cell region 122. Therefore, when carrying out CMP in the step of FIG. 11H, the second embodiment can suppress occurrence of flaws such as dishing and residual films, etc. more than the first embodiment can.

Other Embodiments

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the top surfaces of the element isolation insulation layers 43 may be located at a height lower than the top surfaces of the floating electrode layers 42 and higher than the top surfaces of the element isolation insulation layers 33.

What is claimed is:

1. A nonvolatile semiconductor memory device, comprising:
   a semiconductor substrate;
   a memory cell array region provided on the semiconductor substrate and having memory transistors for storing data arranged therein;
   a first dummy cell region provided on the semiconductor substrate and having first dummy cells not used for storing data arranged therein; and
   a second dummy cell region provided on the semiconductor substrate and having second dummy cells not used for storing data arranged therein, the first dummy cell region being provided between the memory cell array region and the second dummy cell region and including:
   first gate insulation layers provided on the semiconductor substrate;
   first floating electrode layers provided on the first gate insulation layers and forming the first dummy cells; and
   a first element isolation insulation layer formed to adjoin the first floating electrode layers and electrically isolating the first dummy cells from each other, a top surface of the first element isolation insulation layer being located at a height lower than top surfaces of the first floating electrode layers, the second dummy cell region including:

second gate insulation layers provided on the semiconductor substrate and having a thickness larger than that of the first gate insulation layers;

second floating electrode layers provided on the second gate insulation layers and forming the second dummy cells; and a second element isolation insulation layer formed to adjoin the second floating electrode layers and electrically isolating the second dummy cells from each other, a top surface of the second element isolation insulation layer being located at the same height as top surfaces of the second floating electrode layers, or at a height lower than the top surfaces of the second floating electrode layers and higher than the top surface of the first element isolation insulation layer, the first dummy cell region and the second dummy cell region including:

a third element isolation insulation layer formed at a boundary between the first dummy cell region and the second dummy cell region and electrically isolating the first dummy cells and the second dummy cells from each other;

a block insulation layer formed on the first element isolation insulation layer, the second element isolation insulation layer, the third element isolation insulation layer, the first floating electrode layers, and the second floating electrode layers; and a conductive layer formed on the first element isolation insulation layer, the second element isolation insulation layer, the third element isolation insulation layer, the first floating electrode layer, and the second floating electrode layer via the block insulation layer, and functioning as gates of the memory transistors, the third element isolation insulation layer having a top surface, the end portion of the top surface adjoining the first floating electrode layer being located at a height lower than the top surface of the first floating electrode layer, and the top surface of the third element isolation insulation layer having a gradient ascending from a side surface of the first floating electrode layer toward a side surface of the second floating electrode layer, and a distance between the end portion of the top surface of the third element isolation insulation layer adjoining the first floating electrode layer and the top surface of the first floating electrode layer is substantially larger than a distance between the end portion of the top surface of the third element isolation insulation layer adjoining the second floating electrode and the top surface of the second floating electrode layer.

2. The nonvolatile semiconductor memory device according to claim 1, wherein bottom surfaces of the first gate insulation layers are located at the same height as bottom surfaces of the second gate insulation layers.

3. The nonvolatile semiconductor memory device according to claim 1, wherein top surfaces of the first gate insulation layers are located at the same height as top surfaces of the second gate insulation layers, and the top surfaces of the first floating electrode layers are located at the same height as the top surfaces of the second floating electrode layers.

4. The nonvolatile semiconductor memory device according to claim 1, wherein the first floating electrode layer within the first dummy cell region closest to the boundary has a width larger than a minimum feature size, and the second floating electrode layer within the second dummy cell region closest to the boundary has a width larger than the minimum feature size.

5. The nonvolatile semiconductor memory device according to claim 1, wherein the memory cell array region includes:

third gate insulation layers provided on the semiconductor substrate;

third floating electrode layers provided on the third gate insulation layers and forming the memory transistors; and a fourth element isolation insulation layer formed to adjoin the third floating electrode layers and electrically isolating the memory transistors from each other, the block insulation layer is formed on the third floating electrode layers and the fourth element isolation insulation layer, the conductive layer is formed on the third floating electrode layers via the block insulation layer, and a top surface of the fourth element isolation insulation layer is lower than top surfaces of the third floating electrode layers.

6. The nonvolatile semiconductor memory device according to claim 5, wherein the third gate insulation layers have a width same as a minimum feature size.

7. The nonvolatile semiconductor memory device according to claim 5, wherein the memory cell array region includes:

plural ones of the memory transistors connected in series;

a first transistor connected to one end of the memory transistors connected in series; and a second transistor connected to the other end of the memory transistors connected in series.

8. The nonvolatile semiconductor memory device according to claim 7, wherein the first transistor and the second transistor each include:

a fourth gate insulation layer provided on the semiconductor substrate; and a gate electrode layer provided on the fourth gate insulation layer.

9. The nonvolatile semiconductor memory device according to claim 1, further comprising a peripheral circuit region provided on the semiconductor substrate to adjoin the second dummy cell region and controlling the memory transistors, wherein the peripheral circuit region includes:

a fourth gate insulation layer provided on the semiconductor substrate;

a gate electrode layer provided on the fourth gate insulation layer and forming a transistor; and a fifth element isolation insulation layer formed to adjoin the fourth gate insulation layer.

10. The nonvolatile semiconductor memory device according to claim 9, wherein a thickness of the fourth gate insulation layer is the same as that of the second gate insulation layers.

11. The nonvolatile semiconductor memory device according to claim 1, wherein the conductive layer includes a silicide.

12. The nonvolatile semiconductor memory device according to claim 1,
wherein the first gate insulation layers, the second gate insulation layers, the block insulation layer, the first element isolation insulation layer, and the second element isolation insulation layer each includes a silicon oxide.

* * * * *